United States Patent
Uzuka et al.

(10) Patent No.: US 6,392,142 B1
(45) Date of Patent: *May 21, 2002

(54) PRINTED WIRING BOARD MOUNTING STRUCTURE

(75) Inventors: Yoshinori Uzuka; Koji Hanada, both of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/288,298

(22) Filed: Apr. 8, 1999

(30) Foreign Application Priority Data

Apr. 28, 1998 (JP) .......................... 10-119021

(51) Int. Cl.⁷ ..................... H01R 12/18; H05K 1/14
(52) U.S. Cl. ..................... 174/52.1; 361/788; 439/61; 439/65
(58) Field of Search .................. 174/52.1; 361/788, 361/736, 748, 784, 785, 791, 792; 439/61, 65

(56) References Cited

U.S. PATENT DOCUMENTS

| | | | | |
|---|---|---|---|---|
| 4,703,394 A | * | 10/1987 | Petit et al. ................. 361/413 |
| 4,838,798 A | * | 6/1989 | Evans et al. ................ 439/61 |
| 5,062,801 A | * | 11/1991 | Roos ......................... 439/61 |
| 5,211,565 A | * | 5/1993 | Krajewski et al. ............ 439/65 |
| 5,335,146 A | * | 8/1994 | Stucke ....................... 361/785 |
| 5,352,123 A | * | 10/1994 | Sample et al. ............... 439/61 |
| 5,406,453 A | * | 4/1995 | Cusato et al. ............... 361/738 |
| 5,488,542 A | * | 1/1996 | Ito .......................... 361/793 |
| 5,633,479 A | * | 5/1997 | Hirano ....................... 174/255 |
| 5,887,158 A | * | 3/1999 | Sample et al. ............... 395/500 |
| 5,926,378 A | * | 7/1999 | DeWitt et al. ............... 361/788 |
| 6,052,276 A | * | 4/2000 | Do et al. .................... 361/684 |

FOREIGN PATENT DOCUMENTS

JP 11-53077 2/1999

\* cited by examiner

Primary Examiner—Dean A. Reichard
Assistant Examiner—Carmelo Oliva
(74) Attorney, Agent, or Firm—Armstrong, Westerman & Hattori, LLP.

(57) ABSTRACT

A back panel has front-surface-side connectors on the front surface thereof and rear-surface-side connectors on the rear surface thereof. A plurality of front-surface-side printed wiring boards are mounted on the back panel as a result of connectors provided on an end of the plurality of front-surface-side printed wiring boards being connected with the front-surface-side connectors. A plurality of rear-surface-side printed wiring boards are mounted on the back panel as a result of connectors provided on ends of the plurality of rear-surface-side printed wiring boards being connected with the rear-surface-side connectors. When seen from the front side of the back panel, the front-surface-side connectors and the rear-surface-side connectors are orthogonal, and the front-surface-side printed wiring boards and the rear-surface-side printed wiring boards are orthogonal.

1 Claim, 23 Drawing Sheets

PRINTED WIRING BOARD MOUNTING STRUCTURE

BACKGROUND OF THE INVENTION

1. Field of the Invention

The present invention relates to a printed wiring board mounting structure, and, in particular, to a printed wiring board mounting structure which is a part of a communication apparatus, an information processing apparatus, or the like, in which structure a plurality of printed wiring boards are mounted on a back panel side-by-side.

2. Description of the Related Art

FIGS. 1A and 1B show a printed wiring board mounting structure 10 in the related art which is incorporated into a shelf (not shown in the figures) of a communication apparatus. The printed wiring board mounting structure 10 includes a back panel 11 having a multilayer wiring structure, and a plurality of printed wiring board units 12. Each unit of the plurality of printed wiring board units 12 includes a printed wiring board 13 on which an LSI circuit 14, and so forth, are mounted. The plurality of printed wiring board units 12 are connected with the back panel 11 through connectors, and mounted on a front surface 11a of the back panel 11 side-by-side, each board unit 12 extending vertically as shown in the figures. The plurality of printed wiring board units 12 are electrically connected by wiring patterns in the back panel 11.

FIGS. 2A and 2B show a printed wiring board mounting structure 20 in the related art, which structure is incorporated into a shelf (not shown in the figures) of an information processing apparatus. The printed wiring board mounting structure 20 is used for performing information processing. The structure 20 includes a back panel 21 which has a multilayer wiring structure. The structure 20 further includes a plurality of front-surface-side printed wiring board units 22 which are mounted on, and connected with, the back panel 21 through connectors on a front surface 21a thereof, side by side, each unit 22 extending vertically as shown in the figures. The structure 20 further includes a plurality of rear-surface-side printed wiring board units 30 which are mounted on, and connected with, the back panel 21 through connectors on a rear surface 21b thereof, side-by-side, each unit 30 extending vertically as shown in the figures. Each of the front-surface-side printed wiring board units 22 includes a printed wiring board 23 on which an LSI circuit 24 is mounted. Each of the rear-surface-side printed wiring board units 30 includes a printed wiring board 31 on which an LSI circuit 32 is mounted. Each of the LSI circuits 24 and 32 includes a driver and a receiver and performs information processing. The plurality of front-surface-side printed wiring board units 22 are connected by wiring patterns provided in the back panel 21. The plurality of rear-surface-side printed wiring board units 30 are connected by wiring patterns provided in the back panel 21. The front-surface-side printed wiring board units 22 are connected with the rear-surface-side printed wiring board units 30 by wiring patterns provided in the back panel 21.

In the printed wiring board mounting structure 20, the drivers of the LSI circuits 24 transmit instructions and the receivers of the LSI circuits 24 receive the instructions, between the plurality of front-surface-side printed wiring board units 22. Further, in the printed wiring board mounting structure 20, the drivers of the LSI circuits 32 transmit instructions and the receivers of the LSI circuits 32 receive the instructions, between the plurality of rear-surface-side printed wiring board units 30. Further, in the printed wiring board mounting structure 20, the drivers of the LSI circuits 24 and 32 transmit instructions and the receivers of the LSI circuits 24 and 32 receive the instructions, between the front-surface-side printed wiring board units 22 and the rear-surface-side printed wiring board units 30.

The printed wiring board mounting structure 10 shown in FIGS. 1A and 1B has the following problems:

Recently, as the processing capacities of the respective printed wiring board units 12 increase, an increase in the number of wiring patterns to be provided in the back panel 11 is needed. In order to increase the number of wiring patterns to be provided in the back panel 11, it is necessary to increase the number of wiring layers of the back panel 11, or to add a jumper wire 15 shown in FIG. 1B. When the number of wiring layers of the back panel 11 is increased, the cost for manufacturing the back panel 11 increases considerably. When the jumper wire 15 is added, the reliability of the back panel 11 is degraded.

The printed wiring board mounting structure 20 shown in FIGS. 2A and 2B has the following problems:

With reference to FIG. 3, transmission of instructions and reception of information between the front-surface-side printed wiring board unit 22-1, the front-surface-side printed wiring board unit 22-2 and the rear-surface-side printed wiring board 30-1 will now be considered. Instructions from the LSI circuit 24-1 of the front-surface-side printed wiring board unit 22-1 pass through a path 40 in the back panel 21 and reach the LSI circuit 24-2 of the front-surface-side printed wiring board unit 22-2. Information from the LSI circuit 24-2 passes through the path 40 and reaches the LSI circuit 24-1. Further, instructions from the LSI circuit 24-1 of the front-surface-side printed wiring board unit 22-1 pass through a path 41 in the back panel 21 and reach the LSI circuit 32-1 of the rear-surface-side printed wiring board unit 30-1. Information from the LSI circuit 32-1 passes through the path 41 and reaches the LSI circuit 24-1. Each of the paths 40 and 41 is long.

The fact that each of the paths 40 and 41 is long is an obstacle to improvement in speed of information processing.

SUMMARY OF THE INVENTION

An object of the present invention is to provide a printed wiring board mounting structure which solves the above-described problems.

A printed wiring board mounting structure, according to the present invention, comprises:

a back panel having front-surface-side connectors on the front surface thereof and at least one rear-surface-side connector on the rear surface thereof;

a plurality of front-surface-side printed wiring boards which are mounted on the back panel as a result of connectors provided on the plurality of front-surface-side printed wiring boards being connected with the front-surface-side connectors; and at least one rear-surface-side printed wiring board which is mounted on the back panel as a result of at least one connector provided on the at least one rear-surface-side printed wiring board being connected with the at least one rear-surface-side connector, wherein, when seen from the front side of the back panel, the at least one rear-surface-side printed wiring board connected with the at least one rear-surface-side connector crosses the front-surface-side printed wiring boards connected with the front-surface-side connectors.

In this arrangement, the at least one rear-surface-side printed wiring board can act as a part of the back panel. Thereby, it is possible to reduce the number of wiring layers of the back panel. Thus, it is possible to reduce the load borne by the back panel itself. As a result, it is possible to reduce the manufacturing cost. Further, it is not necessary to provide jumper wires, and, thereby, it is possible to improve reliability. Further, when signal processing devices are mounted on the at least one rear-surface-side printed wiring board, the signals are transmitted between the signal processing devices wholly in the at least one rear-surface-side printed wiring board. In this arrangement, in comparison to the related art in which signals are transmitted through the back panel, it is possible to shorten the signal transmission paths, and to improve the signal processing speed.

A server, according to the present invention, is provided with a printed wiring board mounting structure, and the printed wiring board mounting structure comprises:

a back panel having front-surface-side connectors on the front surface thereof and at least one rear-surface-side connector on the rear surface thereof;

a plurality of front-surface-side printed wiring boards which are mounted on the back panel as a result of connectors provided on the plurality of front-surface-side printed wiring boards being connected with the front-surface-side connectors; and at least one rear-surface-side printed wiring board which is mounted on the back panel as a result of at least one connector provided on the at least one rear-surface-side printed wiring board being connected with the at least one rear-surface-side connector, wherein:

when seen from the front side of the back panel, the at least one rear-surface-side printed wiring board connected with the at least one rear-surface-side connector crosses the front-surface-side printed wiring boards connected with the front-surface-side connectors; and the at least one rear-surface-side printed wiring board has a plurality of devices mounted thereon, which devices perform signal processing, and has wiring patterns which connect the plurality of devices and wiring patterns which connect the plurality of devices with the connectors provided on the end of the at least one rear-surface-side printed wiring board.

In this arrangement, because signals transmitted between the devices pass wholly through the at least one rear-surface-side printed wiring board, in comparison to the related art in which the signals pass through the back panel, the signal transmission paths can be shortened. As a result, it is possible to improve the signal processing speed. As a result, it is possible to provide a server in which the signal processing speed is high in comparison to the related art.

A server, according to another aspect of the present invention, is provided with a printed wiring board mounting structure, and the printed wiring board mounting structure comprises:

a back panel having front-surface-side connectors on the front surface thereof and at least one rear-surface-side connector on the rear surface thereof;

a plurality of front-surface-side printed wiring boards which are mounted on the back panel as a result of connectors provided on the plurality of front-surface-side printed wiring boards being connected with the front-surface-side connectors; and at least one rear-surface-side printed wiring board which is mounted on the back panel as a result of at least one connector provided on the at least rear-surface-side printed wiring board being connected with the at least one rear-surface-side connector, wherein:

when seen from the front side of the back panel, the at least one rear-surface-side printed wiring board connected with the at least one rear-surface-side connector crosses the front-surface-side printed wiring boards connected with the front-surface-side connectors; and the back panel has devices mounted thereon in proximity to portions at which the at least one rear-surface-side connector crosses the front-surface-side connectors when seen from the front side of the back panel, the devices performing signal processing.

In this arrangement, it is possible to effectively shorten the signal transmission paths from the front-surface-side printed wiring boards, through the devices, to the at least one rear-surface-side printed wiring board. As a result, it is possible to improve the signal processing speed. As a result it is possible to achieve the server in which the signal processing speed is high in comparison to the related art.

Other objects and further features of the present invention will become more apparent from the following detailed description when read in conjunction with the accompanying drawings.

DETAILED DESCRIPTION OF THE PREFERRED EMBODIMENTS

A first embodiment of the present invention will now be described.

Figure 1A:
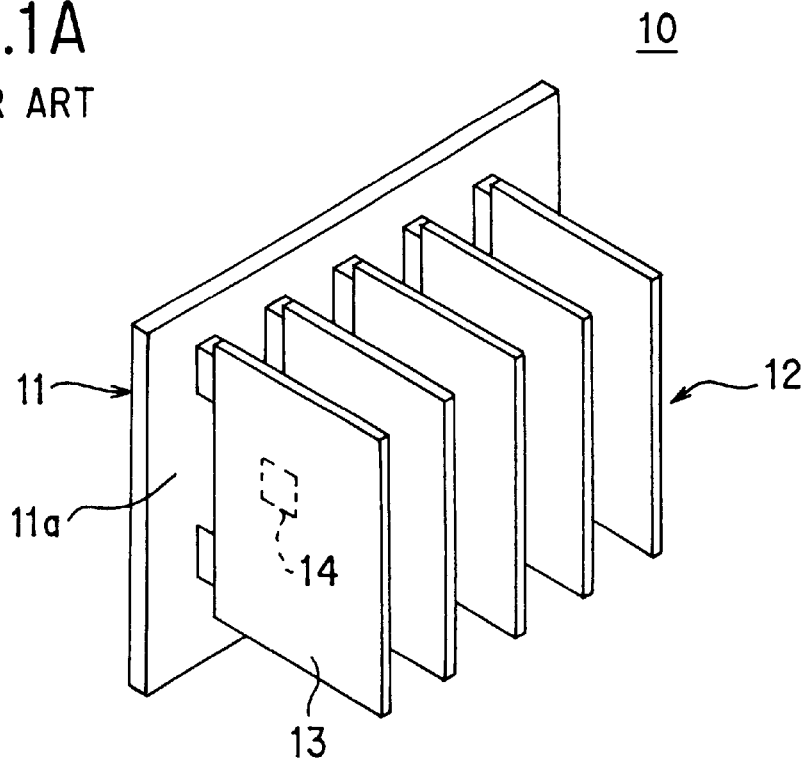
FIGS. 1A and 1B show a printed wiring board mounting structure in one example of the related art.
Figure 1B:
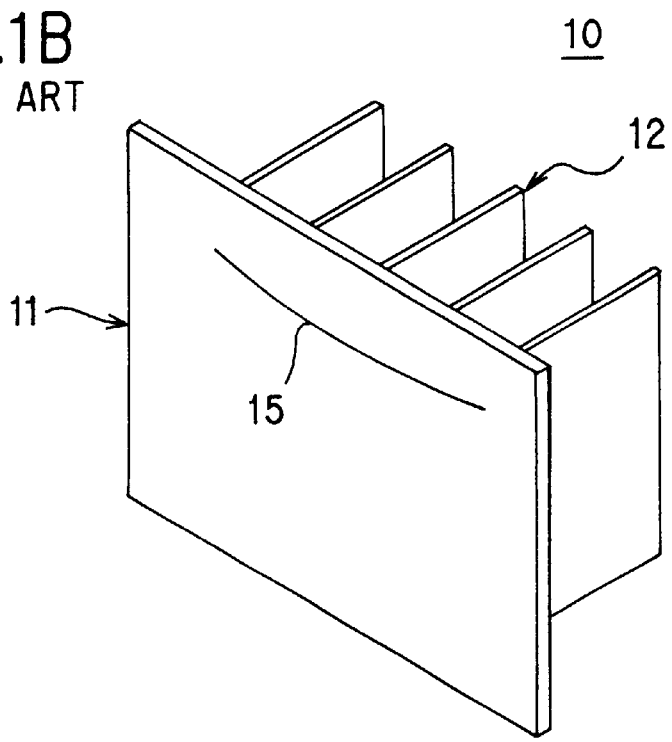
Figure 2A:
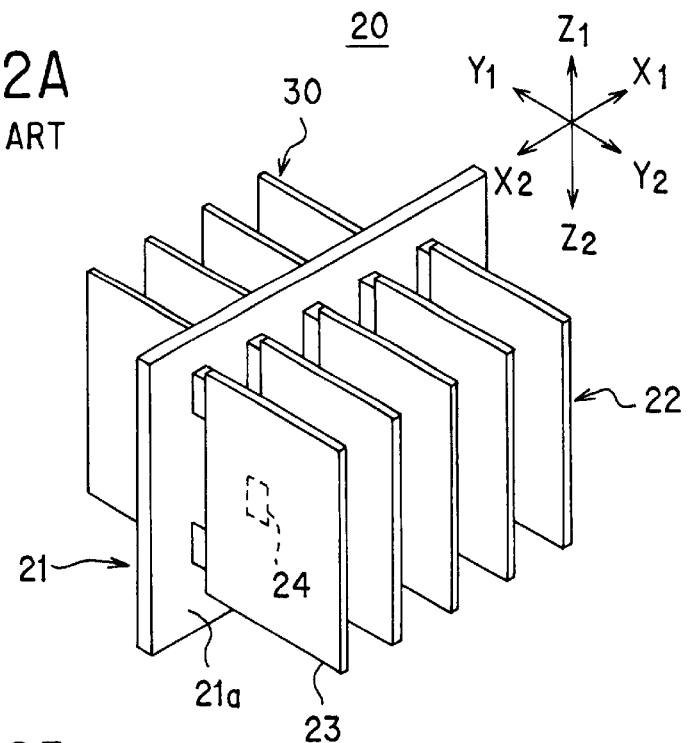
FIGS. 2A and 2B show a printed wiring board mounting structure in another example of the related art.
Figure 2B:
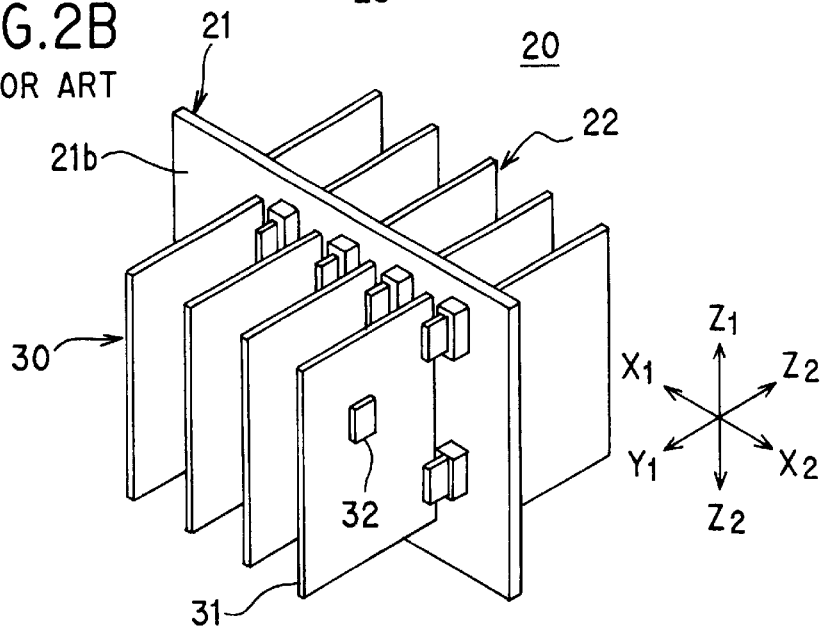
Figure 3:
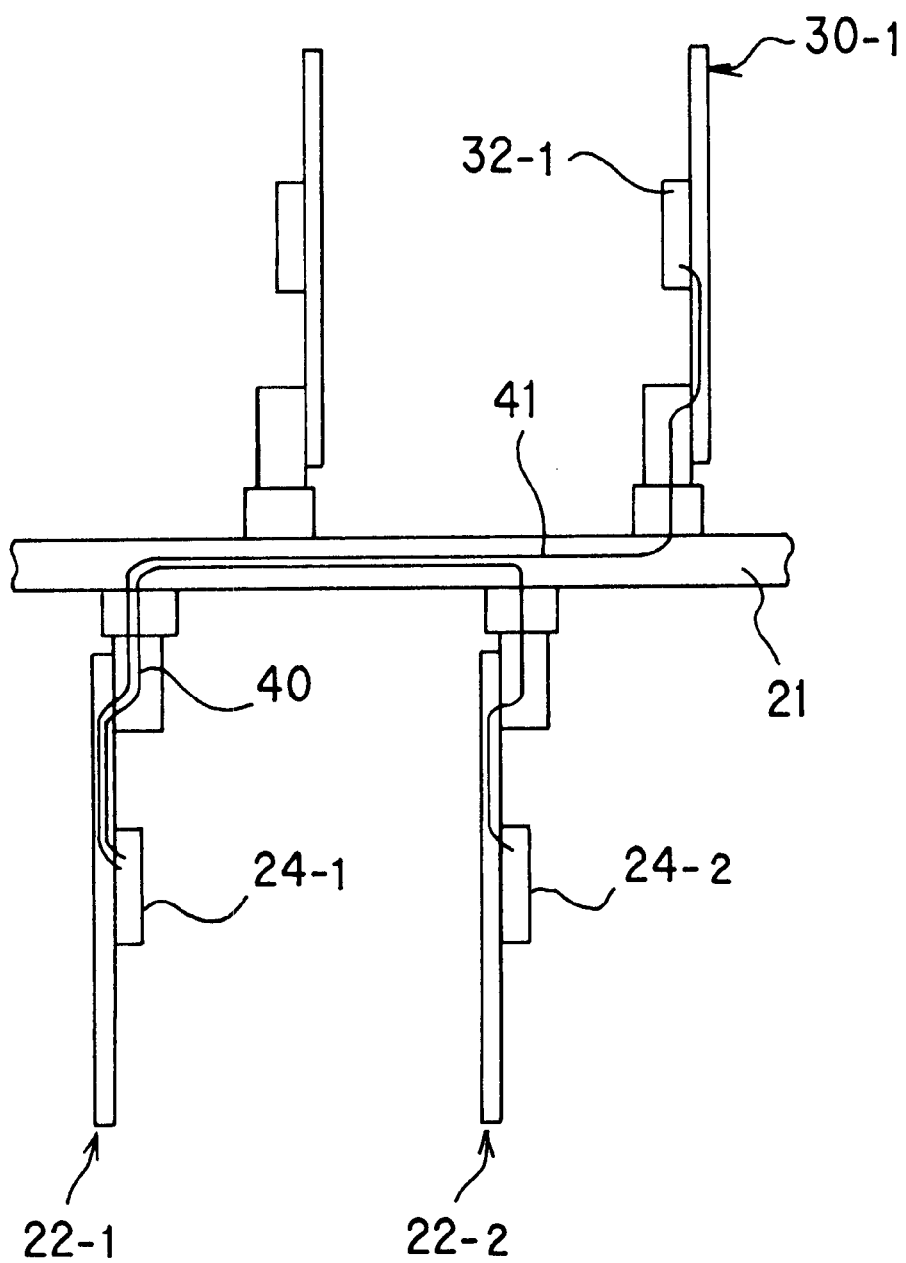
FIG. 3 illustrates problems of the printed wiring board mounting structure shown in FIGS. 2A and 2B.
Figure 4A:
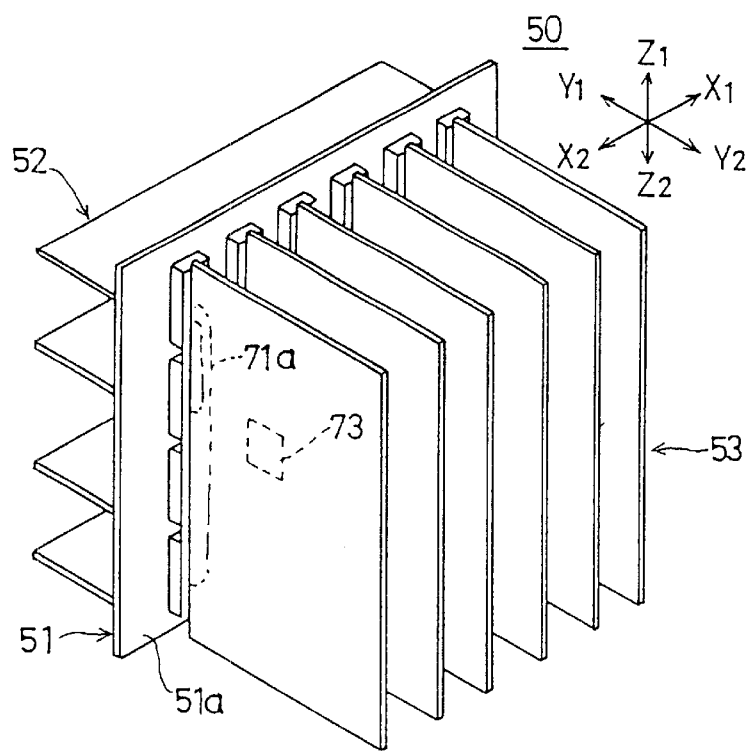
FIGS. 4A and 4B show a printed wiring board mounting structure in a first embodiment of the present invention.
Figure 4B:
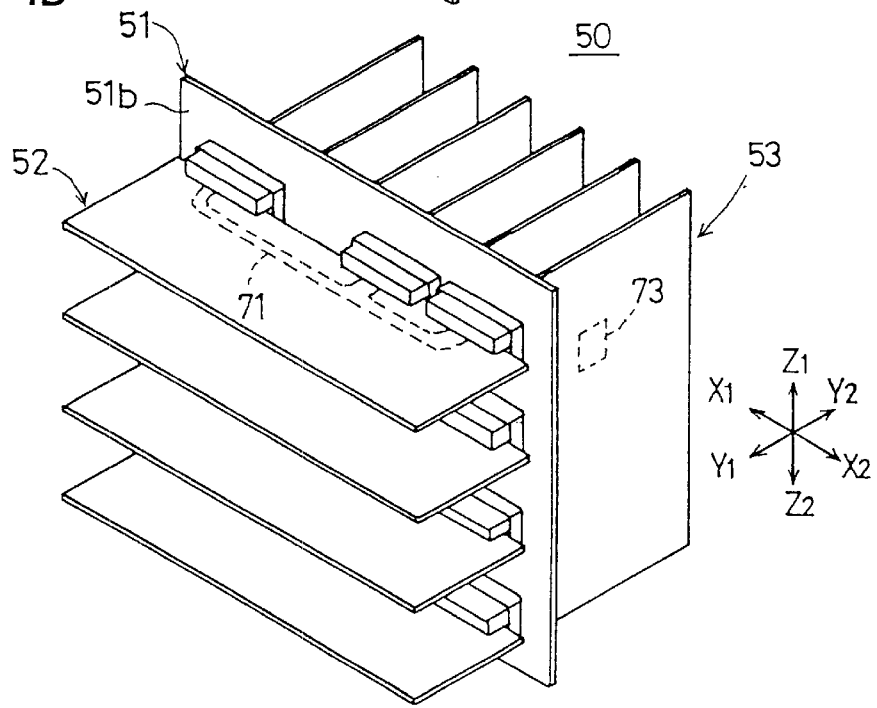
Figure 5:
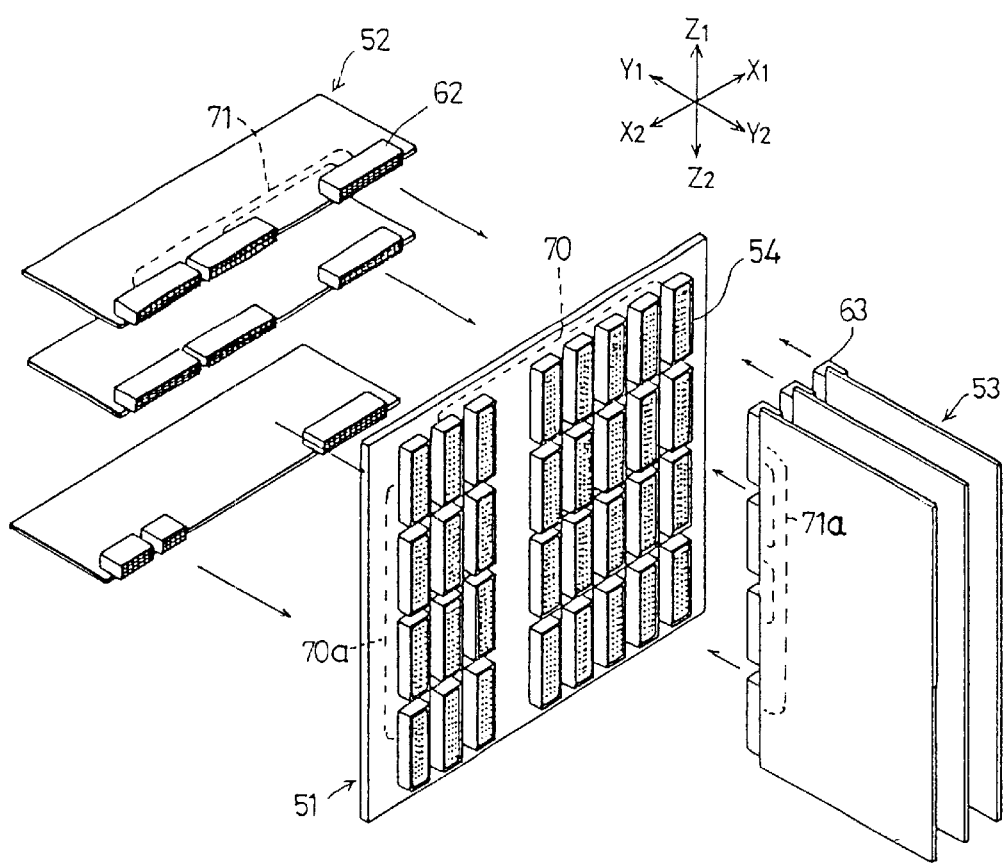
FIG. 5 shows an exploded perspective view of the printed wiring board mounting structure in the first embodiment in the position shown in FIG. 4A.
Figure 6:
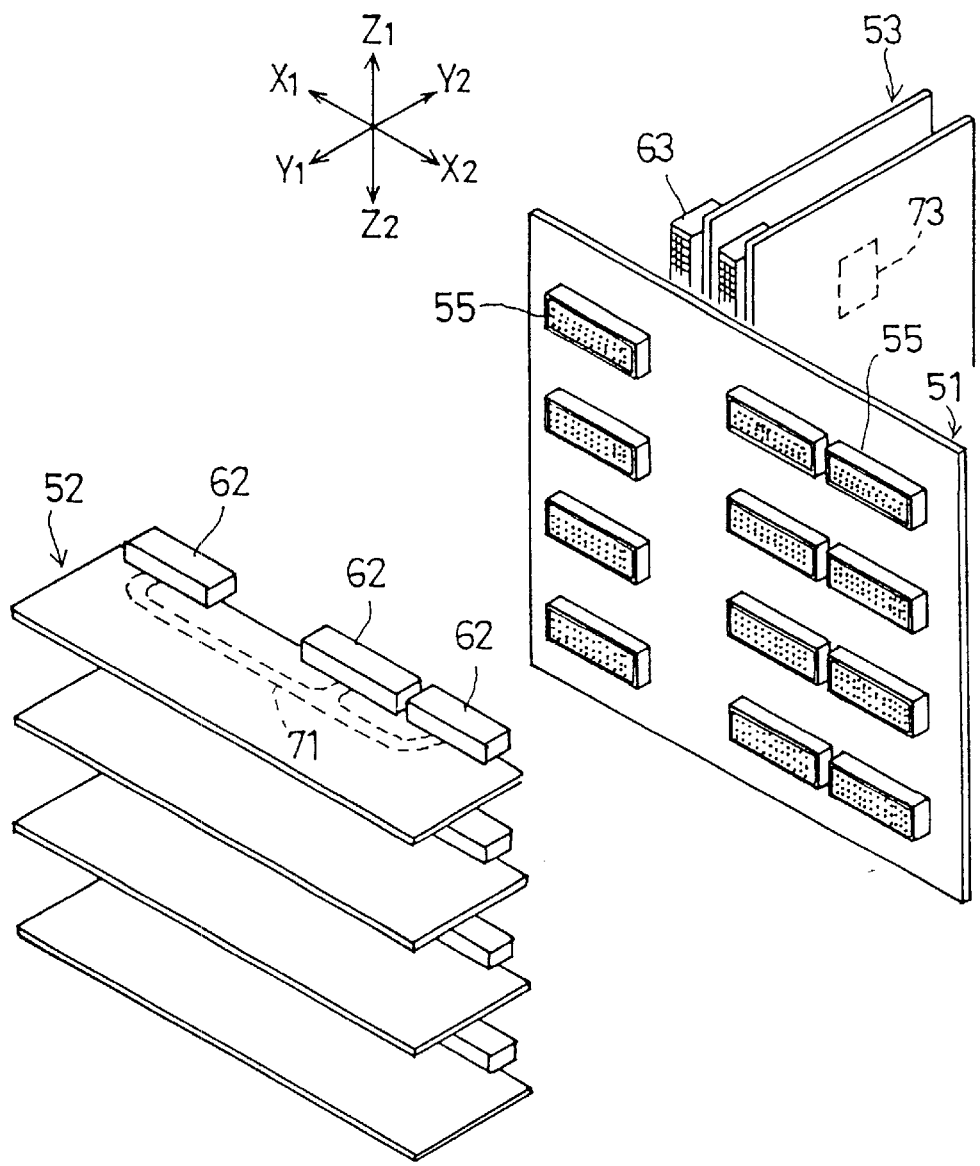
FIG. 6 shows an exploded perspective view of the printed wiring board mounting structure in the first embodiment in the position shown in FIG. 4B.

FIGS. 4A and 4B show a printed wiring board mounting structure 50 in the first embodiment of the present invention. FIGS. 5 and 6 show exploded views of the printed wiring board mounting structure 50 shown in FIGS. 4A and 4B. The printed wiring board mounting structure 50 is incorporated into a shelf (not shown in the figures) of an ordinary communication apparatus.

The printed wiring board mounting structure 50 includes a back panel 51 which is fixed in the shelf, and extends in the X–Z plane. The structure 50 further includes a plurality of rear-surface-side printed wiring boards 52 which are mounted on and electrically connected to the back panel 51 through connectors on the rear surface thereof. The structure 50 further includes a plurality of front-surface-side printed wiring board units 53 which are inserted into the shelf from the front side, and are mounted on, and electrically connected to, the back panel 51 through connectors. Each of the rear-surface-side printed wiring boards 52 extends in the X–Y plane, that is, a horizontal plane. The plurality of rear-surface-side printed wiring boards 52 are arranged in the Z1–Z2 directions side-by-side. The rear-surface-side printed wiring boards 52 are used for providing wiring patterns of the required wiring patterns in the X1–X2 directions which exceed those which the back panel 51 itself can contain. Each of the front-surface-side printed wiring board units 53 extends in the Y–Z plane, that is, a vertical plane. The plurality of front-surface-side printed wiring board units 53 are arranged in the X1–X2 directions side by side. The front-surface-side printed wiring board units 53 are used for providing wiring patterns of the required wiring patterns in the Z1–Z2 directions which exceed those which the back panel 51 itself can contain.

When the printed wiring board mounting structure 50 is seen from the front side thereof, each of the front-surface-side printed wiring board units 53 extends vertically, while each of the rear-surface-side printed wiring boards 52 extends horizontally. Thus, each of the front-surface-side printed wiring board units 53 and each of the rear-surface-side printed wiring boards 52 are in a relationship in which they are orthogonal.

The back panel 51 has a wiring structure including a plurality of wiring layers, and has many wiring patterns 70 extending in X1–X2 directions and many wiring patterns 70a extending in Z1–Z2 directions. The number of the wiring layers is a value such that the back panel 51 can be manufactured with an ordinary yield and at an ordinary cost. The wiring patterns of the required wiring patterns which exceed those which the back panel 51 itself can contain are provided by the rear-surface-side printed wiring boards 52 and the front-surface-side printed wiring board units 53. For this purpose, the rear-surface-side printed wiring boards 52 are mounted on, and electrically connected with, the back panel 51 through connectors on the side of the rear surface, and the front-surface-side printed wiring board units 53 are mounted on, and electrically connected with, the back panel 51 through connectors on the side of the front surface.

The connectors provided on the back panel 51 will now be described.

Figure 7:
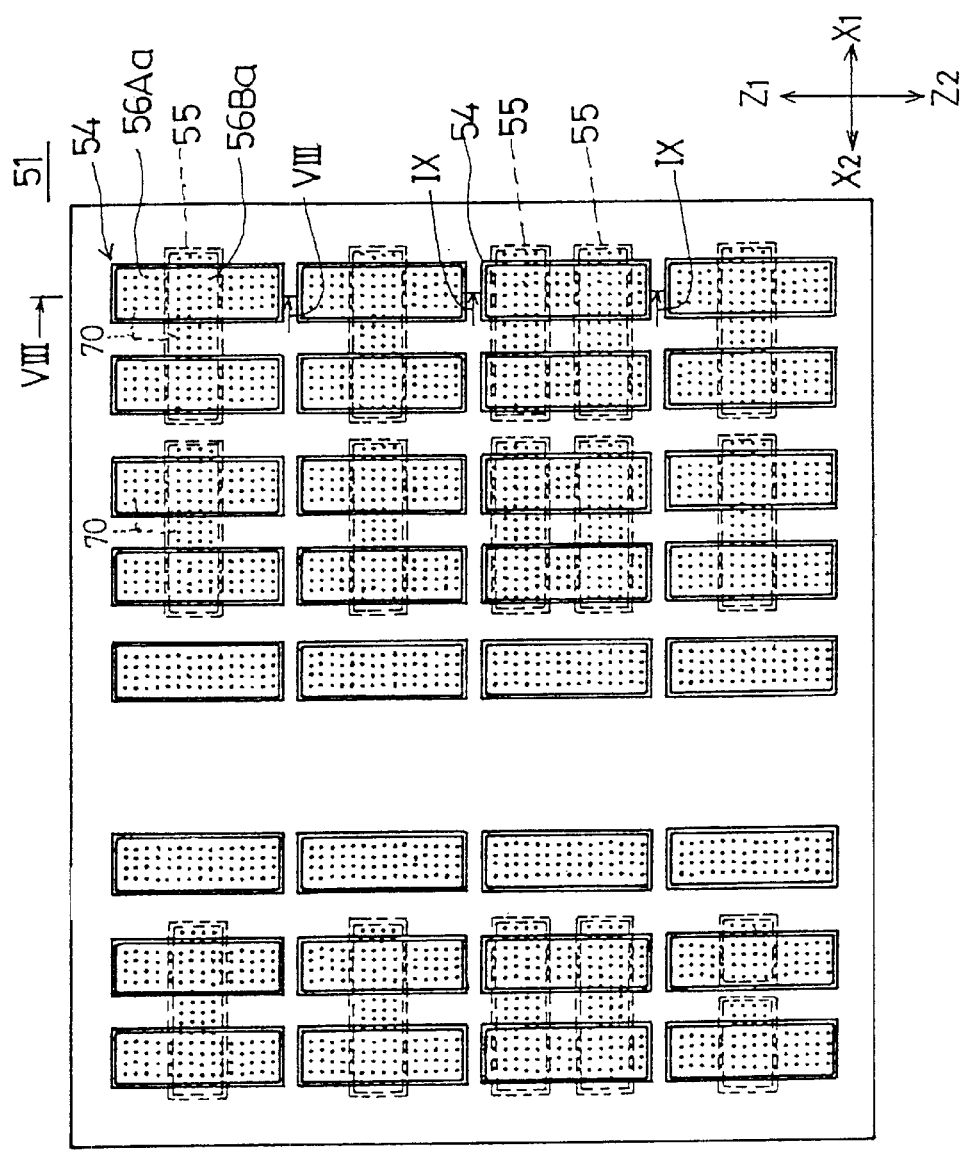
FIG. 7 shows a front elevational view of a back panel shown in FIG. 5.
Figure 8:
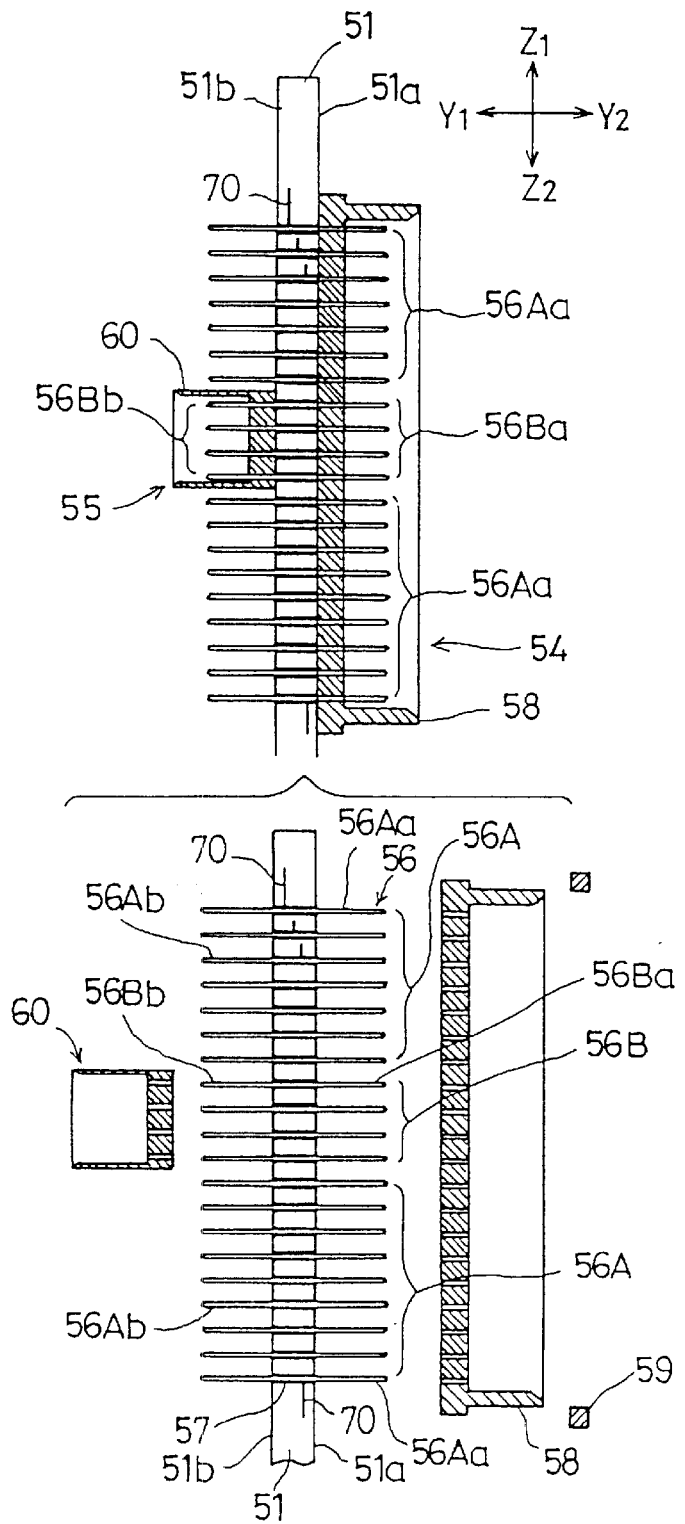
FIG. 8 shows a magnified sectional view taken along the VIII—VIII line shown in FIG. 7.

With reference also to FIGS. 7 and 8, front-surface-side connectors 54 are aligned and provided on the front surface 51a of the back panel 51, and rear-surface-side connectors 55 are aligned and provided on the rear surface 51b of the back panel 51. Each of many press-fitted pins 56 is press-fitted into a respective one of through holes 57 formed in the back panel 51, and passes through the back panel 51. The press-fitted pins 56 are arranged in an arrangement corresponding to the connectors 54. Press-fitted pins 56A of the press-fitted pins 56 are parts of the connectors 54. Press-fitted pins 56B of the press-fitted pins 56 are used in common by, and are parts of, the connectors 54 and the connectors 55. Therefore, the press-fitted pins 56B are referred to as common press-fitted pins. Each of the press-fitted pins 56A includes a respective one of pin portions 56Aa, each of which projects from the front surface 51a of the back panel 51, and a respective one of pin portions 56Ab, each of which projects from the rear surface 51b of the back panel 51. Each of the common press-fitted pins 56B includes a respective one of pin portions 56Ba, each of which projects from the front surface 51a of the back panel 51, and a respective one of pin portions 56Bb, each of which projects from the rear surface 51b of the back panel 51. In a respective one of the through-holes 57, each of the press-fitted pins 56A is electrically connected with a respective one of the wiring patterns 70 and wiring patterns 70a provided in the back panel 51. The through-holes, into which the common press-fitted pins 56B are press-fitted, respectively, are not electrically connected with the wiring patterns 70 and 70a. Therefore, the common press-fitted pins 56B are not electrically connected with the wiring patterns 70 and 70a.

Each of the connectors 54 includes respective ones of the pin portions 56Aa, respective ones of the pin portions 56Ba and a respective one of connector guides 58. Each of the connector guides 58 has the respective ones of the pin portions 56Aa and 56Ba fitted into many holes provided on a bottom plate thereof, and is fixed to the front surface 51a of the back panel 51 by respective ones of holding bars 59. The respective ones of the pin portions 56Aa and 56Ba project in each of the connector guides 58. The longitudinal directions of each of the connectors 54 are the Z1–Z2 directions.

Each of the connectors 55 includes respective ones of the pin portions 56Bb and a respective one of connector guides 60. Each of the connector guides 60 has the respective ones of the pin portions 56Bb fitted into many holes provided on a bottom plate thereof, and is fixed to the rear surface 51b of the back panel 51 by respective ones of holding bars. The respective ones of the pin portions 56Bb project in each of the connector guides 60. The longitudinal directions of each of the connectors 55 are the X1–X2 directions. As shown in FIG. 7, each of the connectors 55 extends over respective two of the connectors 54, which two are adjacent in the X1–X2 directions.

Figure 9:
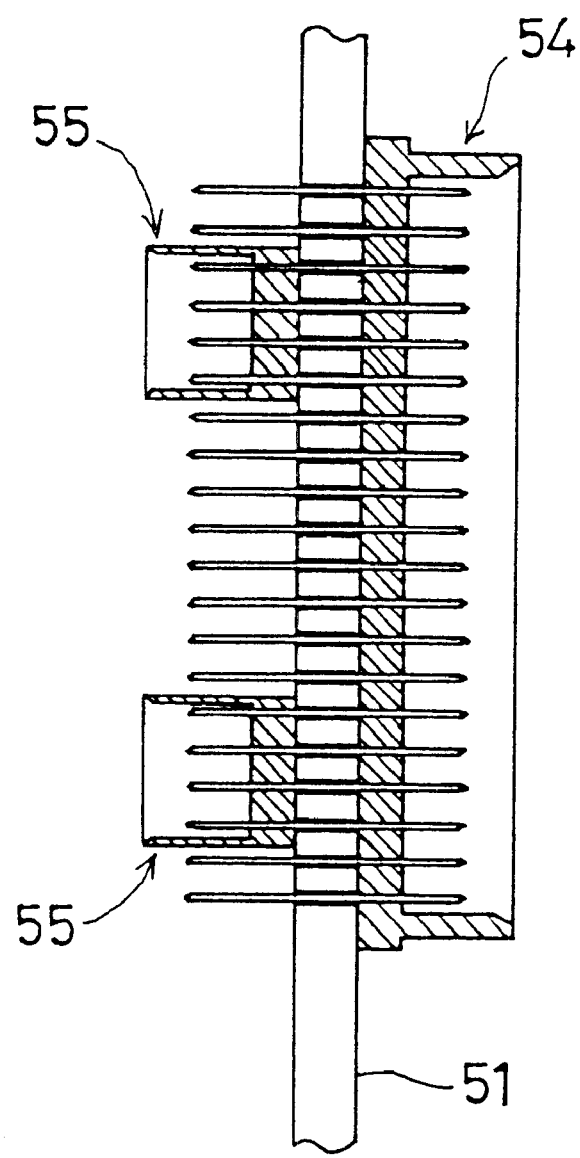
FIG. 9 shows a magnified sectional view taken along the IX—IX line shown in FIG. 7.

Further, as shown in FIG. 9, respective two connectors 55 are provided for each of predetermined connectors 54.

As shown in FIGS. 4A, 4B, 5 and 6, each of the rear-surface-side printed wiring boards 52 has a plurality of wiring patterns 71 extending in the X1–X2 directions. As shown in FIG. 6, the wiring patterns 71 connect a plurality of connectors 62 provided along an end of the rear-surface-side printed wiring board 52. The connectors 62 of the rear-surface-side printed wiring board 52 are connected with respective ones of the connectors 55 so that each of the rear-surface-side wiring boards 52 is mounted on the rear surface 51b of the back panel 51.

As shown in FIG. 5, the press-fitted pins 56A of the connectors 54 located apart from each other in the X1–X2 directions are electrically connected by the wiring patterns 70 provided in the back panel 51. As shown in FIG. 6, the press-fitted pins 56B of the connectors 54 located apart from each other in the X1–X2 directions are electrically connected by the wiring patterns 71 provided in the rear-surface-side printed wiring boards 52.

Each of the front-surface-side printed wiring board units 53 has a plurality of wiring patterns 71a extending in the Z1–Z2 directions, has an LSI circuit 73, and so forth, mounted on a printed wiring board thereof, and has connectors 63 along the inserting end thereof. The connectors 63 of the front-surface-side printed wiring board unit 53 are connected with respective ones of the connectors 54 so that each of the front-surface-side printed wiring board units 53 is mounted on the back panel 51.

As shown in FIG. 5, the front-surface-side printed wiring board units 53 are electrically connected by the wiring patterns 70 provided in the back panel 51 and the wiring patterns 71 provided in the rear-surface-side printed wiring boards 52.

As shown in FIG. 5, the rear-surface-side printed wiring boards 52 are electrically connected by the wiring patterns 70a provided in the back panel 51 and the wiring patterns 71a provided in the front-surface-side printed wiring board units 53.

The above-described printed wiring board mounting structure 50 has the following advantages:

1) Because the rear-surface-side printed wiring boards 52 and the front-surface-side printed wiring board units 53 perform functions of the back panel 51, it is possible that the number of the wiring layers of the back panel 51 can be limited to the value such that the back panel 51 can be manufactured with an ordinary yield and at an ordinary cost. As a result, it is possible that the manufacturing cost of the entirety of the printed wiring board mounting structure 50 can be reduced.

2) The rear-surface-side printed wiring boards 52 have the wiring patterns 71, and are mounted on, and electrically connected with, the back panel 51 through the connectors on the rear surface thereof. Further, the front-surface-side printed wiring board units 53 have the wiring patterns 71a, and are mounted on and electrically connected with, the back panel 51 through connectors on the front surface thereof. Therefore, in comparison to the case where jumper wires are used, it is possible to improve the reliability.

3) Because the rear-surface-side connectors 55 have the pin portions 56Bb of only the common pins 56B, it is possible that the rear-surface-side printed wiring boards 52 are used for electrically connecting the front-surface-side printed wiring board units 53 efficiently.

4) The common pins 56B can be easily provided merely by causing the press-fitted pins to pass through the through holes 57.

Variant embodiments of the above-described embodiment will now be described.

In a first variant embodiment, the back panel 51 has the wiring patterns 70 and the wiring patterns 70a, and the rear-surface-side printed wiring boards 52 have the wiring patterns 71, but the front-surface-side printed wiring board units 53 do not have the wiring patterns 71a.

In a second variant embodiment, the back panel 51 has the wiring patterns 70 but does not have the wiring patterns 70a, and the rear-surface-side printed wiring boards 52 have the wiring patterns 71, but the front-surface-side printed wiring board units 53 do not have the wiring patterns 71a.

Variant embodiments of the connectors 54 and 55 of the back panel 51.will now be described.

Figure 10:
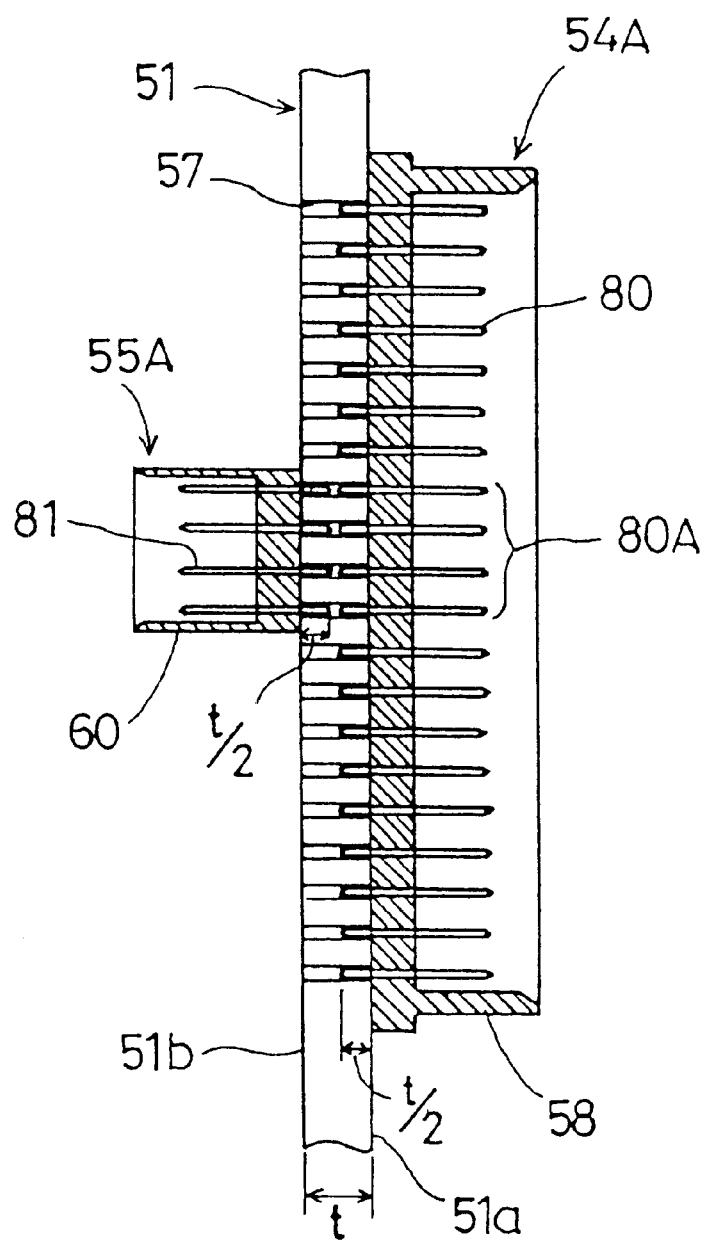
FIG. 10 shows a first variant embodiment of a connector provided on the back panel.

FIG. 10 shows a first variant embodiment. A connector 54A has pins 80 which are press-fitted into the through-holes 57 of the back panel 51 from the side of the front surface 51a, respectively, by a depth which is approximately ½ of the thickness 't' of the back panel 51, instead of the press-fitted pins 56 which pass through the back panel 51 as shown in FIG. 8. A connector 55A has pins 81 which are press-fitted into the through-holes 57 of the back panel 51 from the side of the rear surface 51b, respectively, by a depth which is approximately ½ of the thickness 't' of the back panel 51, instead of the press-fitted pins 56 which pass through the back panel 51 as shown in FIG. 8. Continuity between pins 81 and pins 80A of the pins 80, which pins 80A are aligned with the pins 81, respectively, are provided through the respective ones of the through-holes 57.

The pins 81 and pins 80A are the common pins.

The pins 80 and 81 of the connectors 54A and 55A do not pass through the through-holes 57 and are press-fitted to the positions in the middle of the through-holes 57. Therefore, the pins 80 and 81 are not likely to bend when being press-fitted. Therefore, the pins of the connectors 54A and 55A have small bends. As a result, connection of the rear-surface-side printed wiring boards 52 to the connector 55A and connection of the front-surface-side printed wiring board unit 53 to the connector 54A can be performed with high reliability. Thus, the printed wiring board mounting structure is assembled with high reliability.

Figure 11:
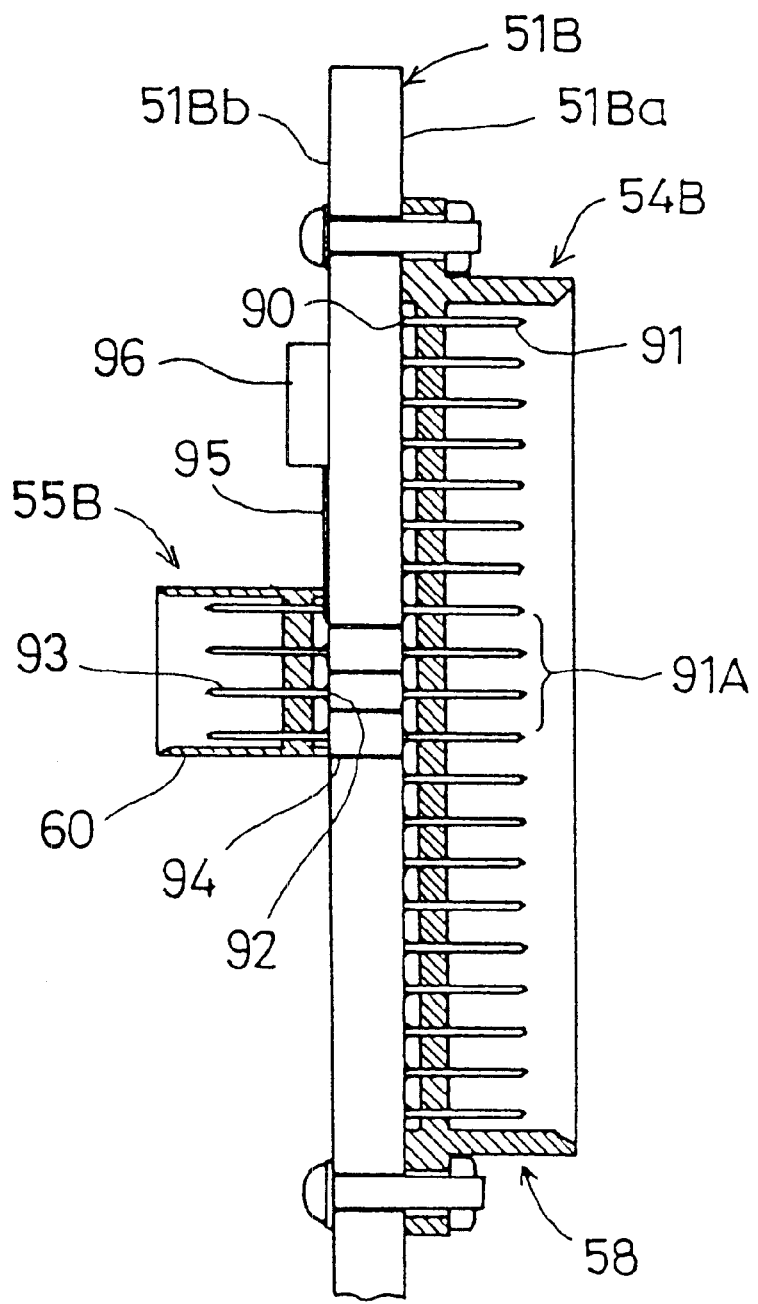
FIG. 11 shows a second variant embodiment of the connector provided on the back panel.

FIG. 11 shows a second variant embodiment. A connector 54B has pins 91 which are soldered and thereby fixed to pads 90 on the front surface 51Ba of a back panel 51B, respectively, instead of the press-fitted pins 56 which pass through the back panel 51 as shown in FIG. 8. A connector 55B has pins 93 which are soldered and thereby fixed to pads 92 on the rear surface 51Bb of the back panel 51B, respectively, instead of the press-fitted pins 56 which pass through the back panel 51 as shown in FIG. 8. The pins 93 and pins 91A of the pins 90, which pins 91A correspond to the pins 93, respectively, are electrically connected through vias 94 in the back panel 51B, respectively.

The pins 93 and pins 91A are the common pins.

Because the pins 91 and 93 of the connectors 54B and 55B are not press-fitted into the back panel 51B, the pins 91 and 93 do not bend. Further, because no through-holes are formed in the back panel 51B, it is possible to form wiring patterns 95 and mount an electronic component 96 on the rear surface 51Bb at a position corresponding to the connector 54B.

A second embodiment of the present invention will now be described.

Figure 12A:
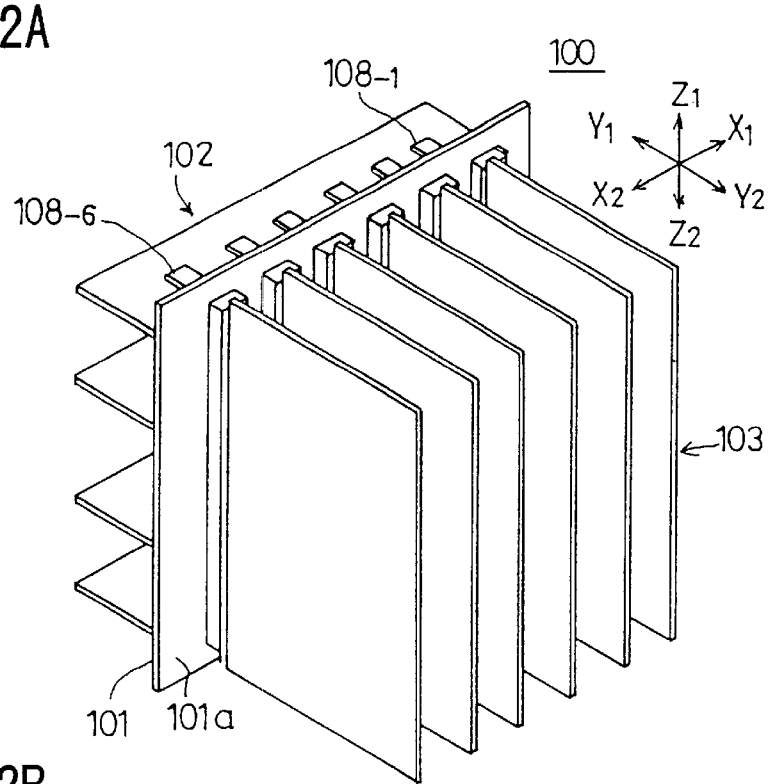
FIGS. 12A and 12B show a printed wiring board mounting structure in a second embodiment of the present invention.
Figure 12B:
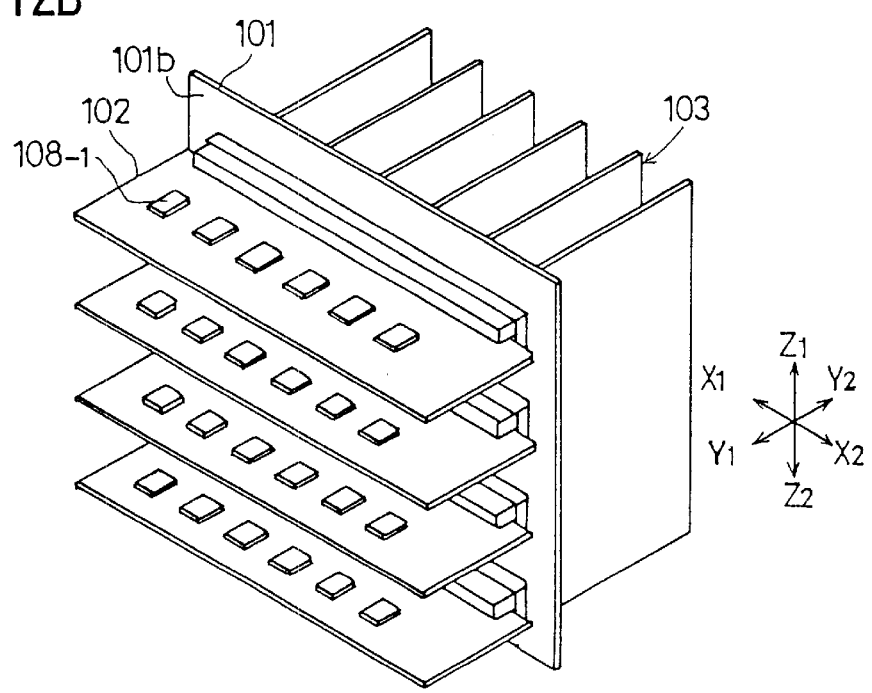
Figure 13:
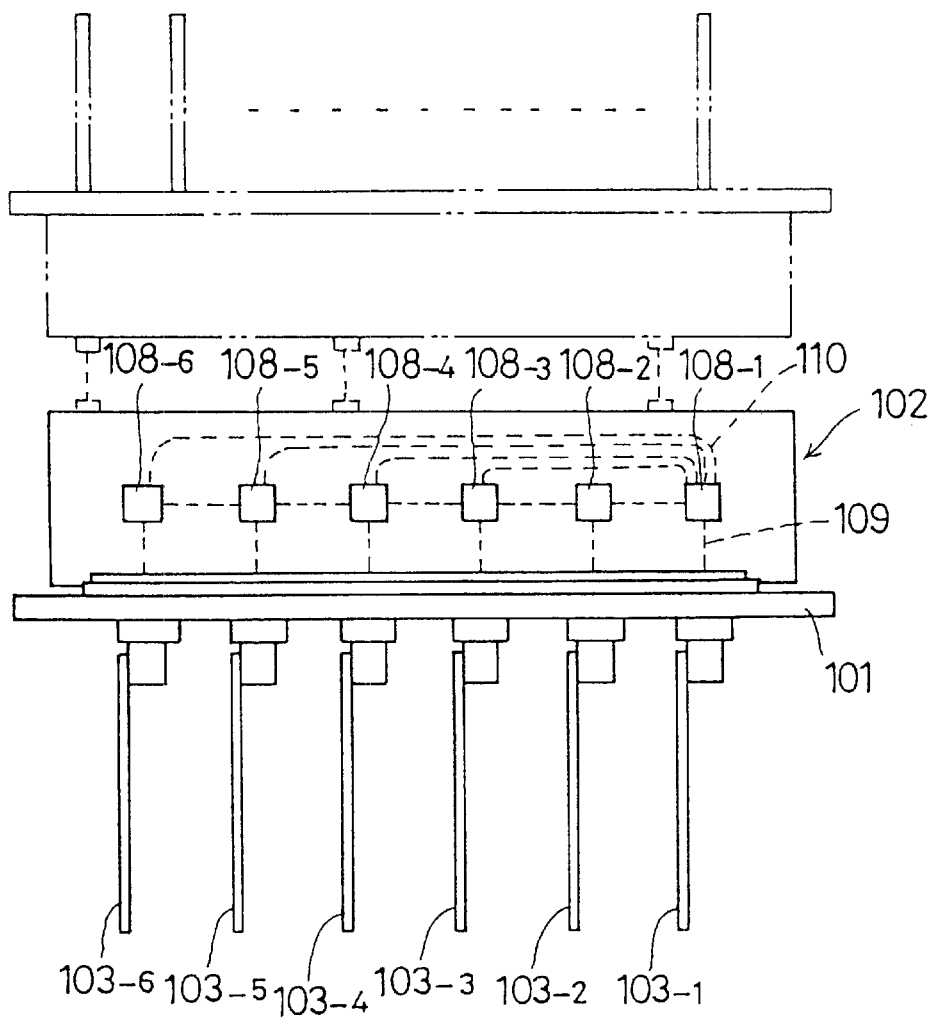
FIG. 13 shows a plan view of the printed wiring board mounting structure shown in FIG. 12A and 12B.
Figure 14:
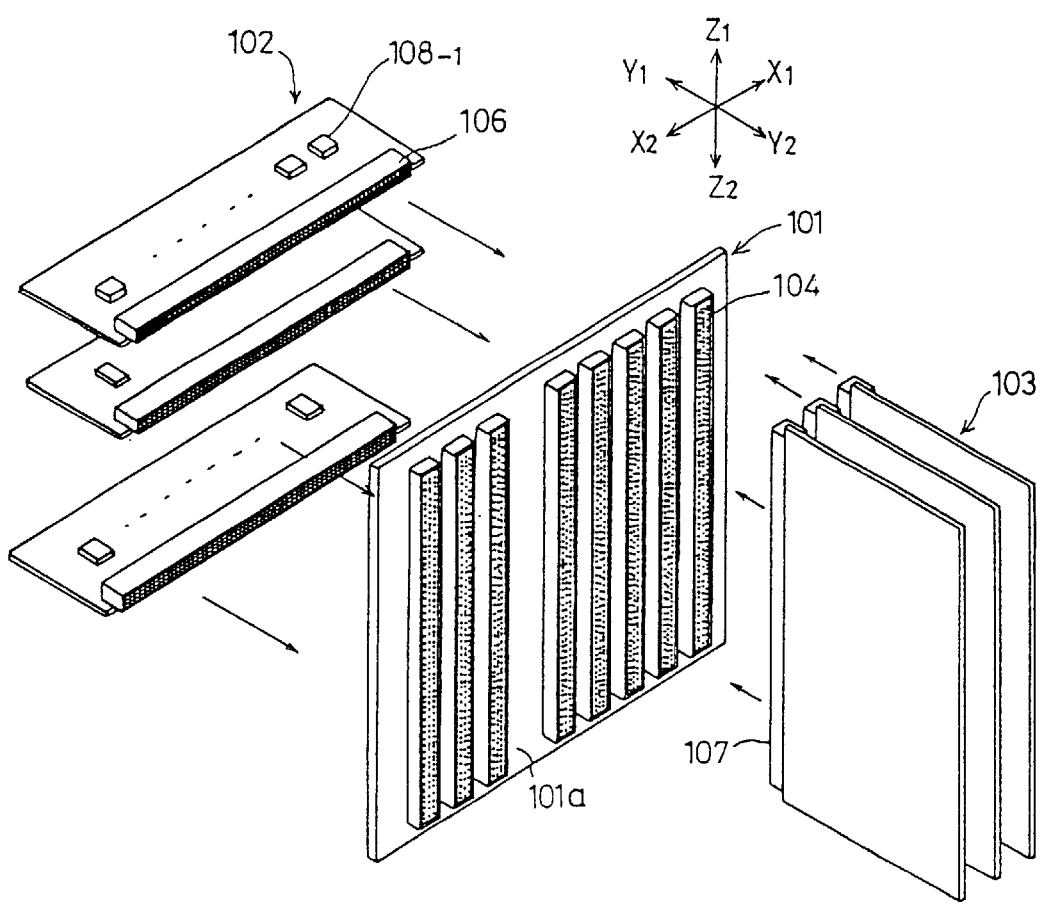
FIG. 14 shows an exploded perspective view of the printed wiring board mounting structure in the second embodiment in the position shown in FIG. 12A.
Figure 15:
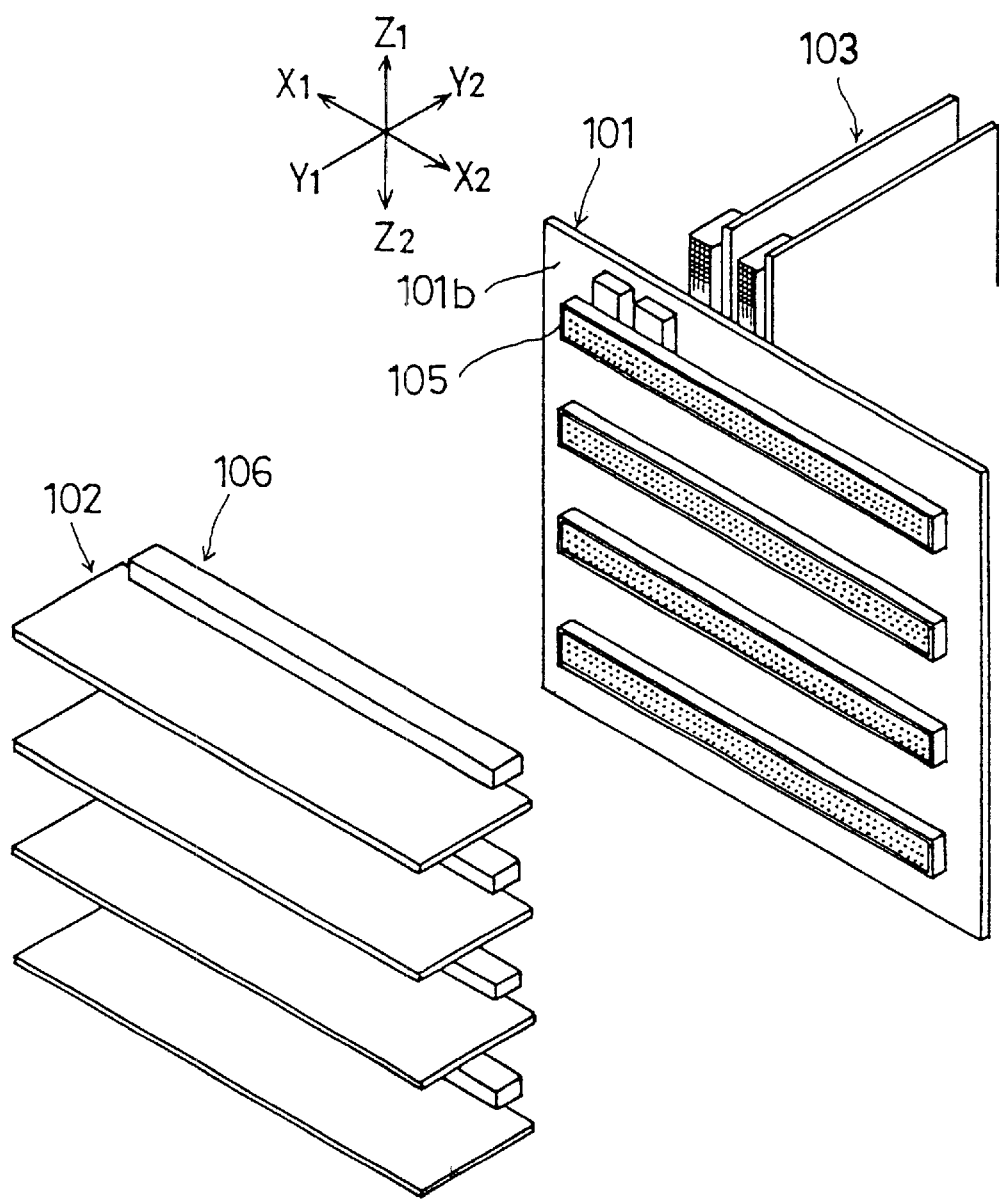
FIG. 15 shows an exploded perspective view of the printed wiring board mounting structure in the second embodiment in the position shown in FIGS. 12B.
Figure 16:
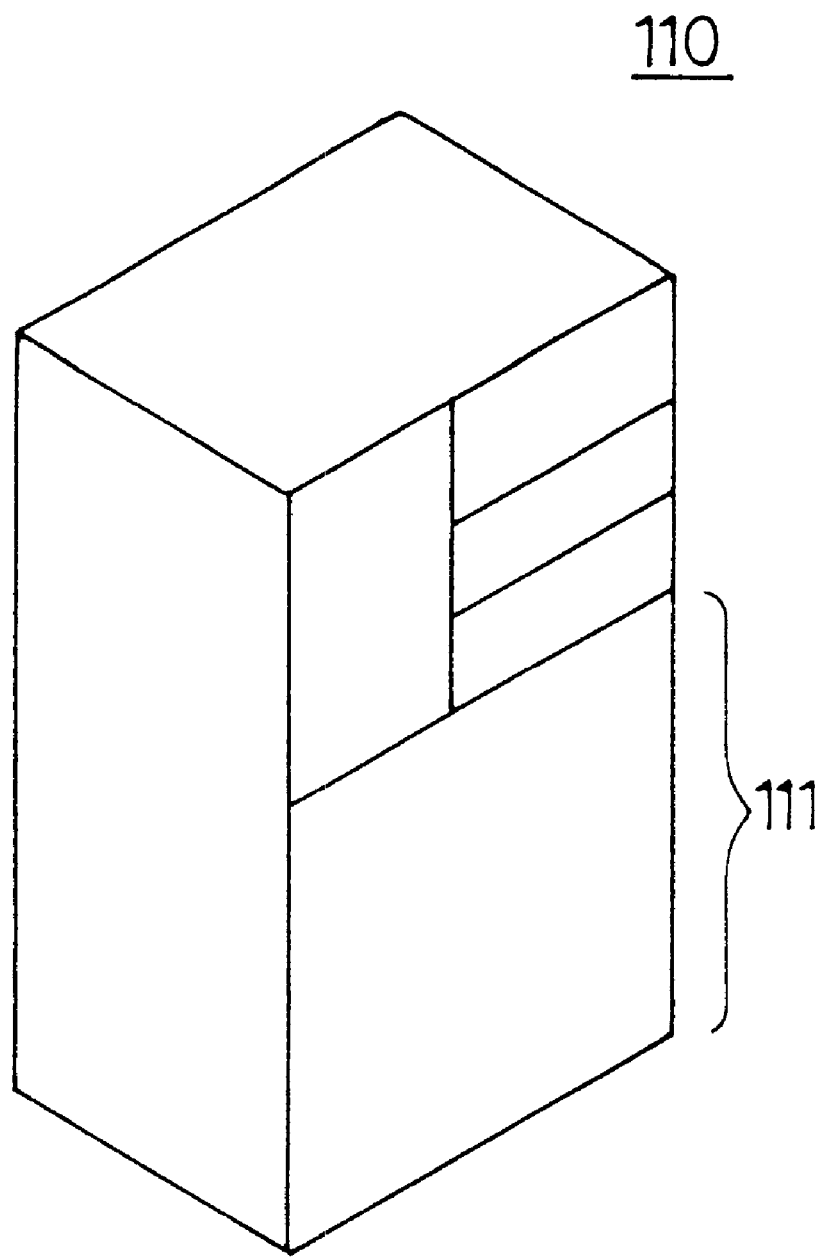
FIG. 16 shows a perspective view of a server.

FIGS. 12A, 12B and 13 show a printed wiring board mounting structure 100 in the second embodiment of the present invention. FIGS. 14 and 15 show exploded views of the printed wiring board mounting structure 100 shown in FIGS. 12A and 12B. The printed wiring board mounting structure 100 is incorporated into a housing 111 of a server 110 shown in FIG. 16 together with a forced-cooling fan and so forth, and performs information processing.

The printed wiring board mounting structure 100 includes a back panel 101 which is fixed in the housing 111 of the server 110 and extends in the X–Z plane. The structure 100 further includes a plurality of rear-surface-side printed wiring board units 102 which are mounted on and electrically connected to, the back panel 101 through connectors on the rear surface thereof. The structure 100 further includes a plurality of front-surface-side printed wiring board units 103 which are inserted into the housing 111 from the front side of the server 110, and are mounted on, and electrically connected with, the back panel 101 through connectors. Each of the rear-surface-side printed wiring board units 102 extends in the X–Y plane, that is, a horizontal plane, and the rear-surface-side printed wiring board units 102 are arranged side by side in the Z1–Z2 directions. Each of the front-surface-side printed wiring board units 103 extends in the Y–Z plane, that is, a vertical plane, and the front-surface-side printed wiring board units 103 are arranged side-by-side in the X1–X2 directions. When the printed wiring board mounting structure 100 is seen from the front side thereof, each of the front-surface-side printed wiring boards 103 extends vertically, and each of the rear-surface-side printed wiring boards 102 extends horizontally. Thus, each of the front-surface-side printed wiring board units 103 and each of the rear-surface-side printed wiring board units 102 are in a relationship in which they are orthogonal.

Figure 17:
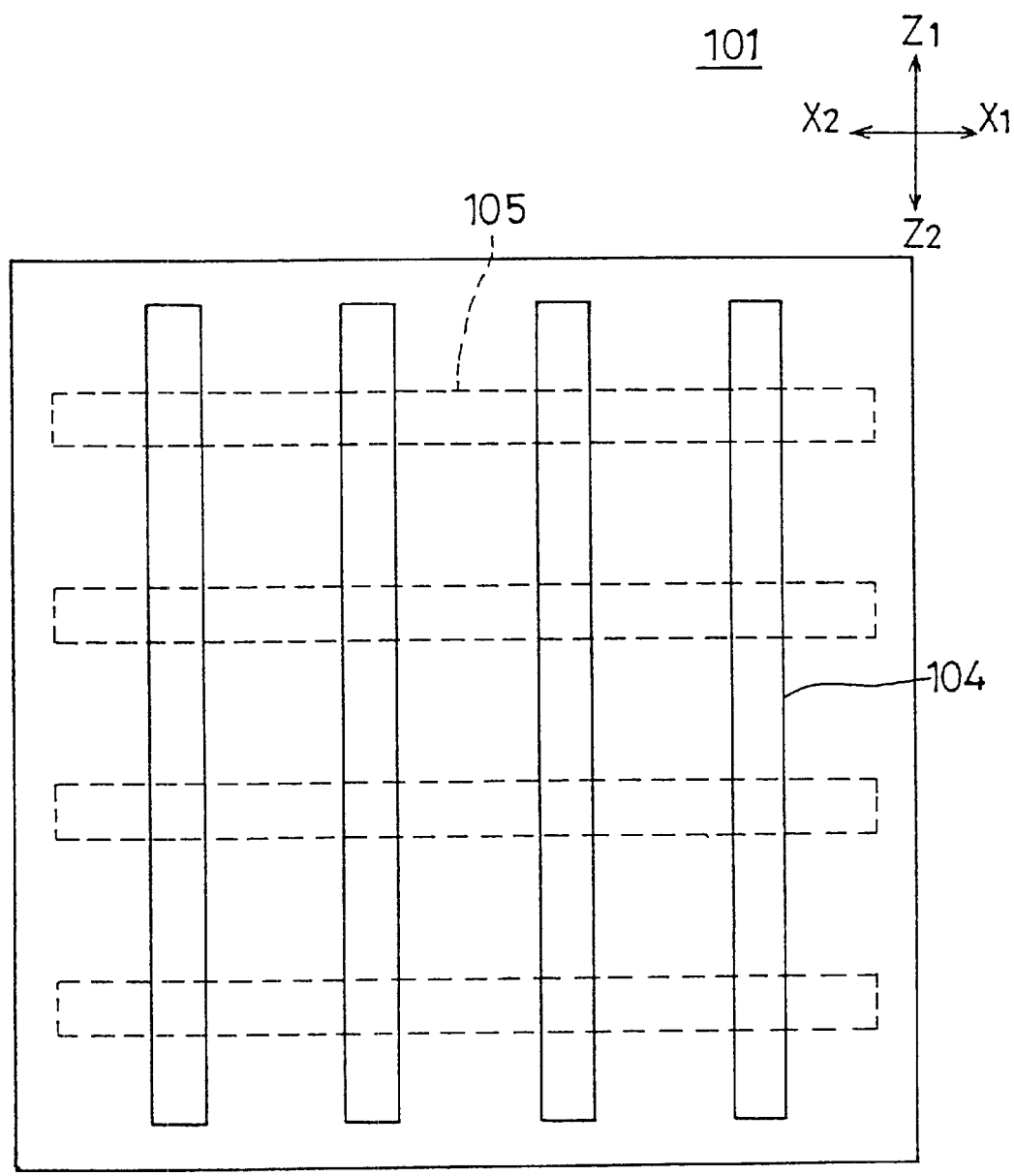
FIG. 17 shows a front elevational view of a back panel shown in FIG. 14.

The back panel 101 has a wiring structure including a plurality of wiring layers. As shown in FIG. 17, front-surface-side connectors 104 are aligned with each other and are provided on the front surface 101a of the back panel 101, and rear-surface-side connectors 105 are aligned with each other and are provided on the rear surface 101b of the back panel 101. Each of the connectors 104 extends in the Z1–Z2 directions through approximately the entire height of the back panel 101. The connectors 104 are arranged side-by-side in the X1–X2 directions. Each of the connectors 105 extends in the X1–X2 directions through approximately the entire width of the back panel 101. The connectors 105 are arranged side by side in the Z1–Z2 directions. Similar to the arrangement shown in FIG. 8, each of the connectors 104 and 105 has many press-fitted pins. The press-fitted pins located at portions at which the connectors 104 and the connectors 105 cross when seen from the front side of the back panel 101 are the common press-fitted pins.

As shown in FIGS. 12A through 15, a connector 106 of each of the rear-surface-side printed wiring board units 102 is connected to a respective one of the connectors 105 of the back panel 101, and, thus, the rear-surface-side printed wiring board units 102 are mounted on the rear surface 101b of the back panel 101. A connector 107 of each of the front-surface-side printed wiring board units 103 is connected to a respective one of the connectors 104 of the back panel 101, and, thus, the front-surface-side printing wiring board units 103 are mounted on the front surface 101a of the back panel 101.

As shown in FIG. 13, on each of the rear-surface-side printed wiring board units 102, a plurality of LSI circuits 108-1 through 108-6 corresponding to the front-surface-side printed wiring board units 103-1 through 103-6, respectively, are mounted. Each of the LSI circuits 108-1 through 108-6 includes a driver and a receiver, and performs information processing. In each of the rear-surface-side printed wiring board units 102, wiring patterns 109 which electrically connect the LSI circuits 108-1 through 108-6 with the corresponding front-surface-side printed wiring board units 103-1 through 103-6, respectively, and wiring patterns 110 which electrically connect the LSI circuits 108-1 through 108-6 are provided.

With reference to FIG. 13, transmission of instructions and reception of information between the front-surface-side printed wiring boards 103-1 and 103-6 which are far from one another will now be considered. The LSI circuit 108-1 corresponds to the front-surface-side printed wiring board unit 103-1, and the LSI circuit 108-6 corresponds to the front-surface-side printed wiring board unit 103-6. Instructions from the front-surface-side printed wiring board unit 103-1 are output from the LSI circuit 108-1, pass through the respective one of the wiring patterns 110, and reach the LSI circuit 108-6, and information from the front-surface-side printed wiring board unit 103-6 is output from the LSI circuit 108-6, passes through the respective one of the wiring patterns 110, and reaches the LSI circuit 108-1. Thus, instructions and information are transmitted wholly in the rear-surface-side printed wiring board units 102, and do not pass through the back panel 101. As a result, transmission paths of instructions and information are short, and, thus, information processing is performed at high speed in comparison to the related art. As a result, it is possible to achieve the server 110 in which the signal processing speed is high in comparison to the related art.

Further, as indicated by the chain double-dashed lines in FIG. 13, the printed wiring board mounting structure 100 can be connected with another printed wiring board mounting structure using the rear-surface-side printed wiring board units 102. Thus, the printed wiring board mounting structure 100 has an extending capacity.

Each of third and fourth embodiments of the present invention is a variant embodiment of the above-described second embodiment.

The third embodiment of the present invention will now be described.

Figure 18:
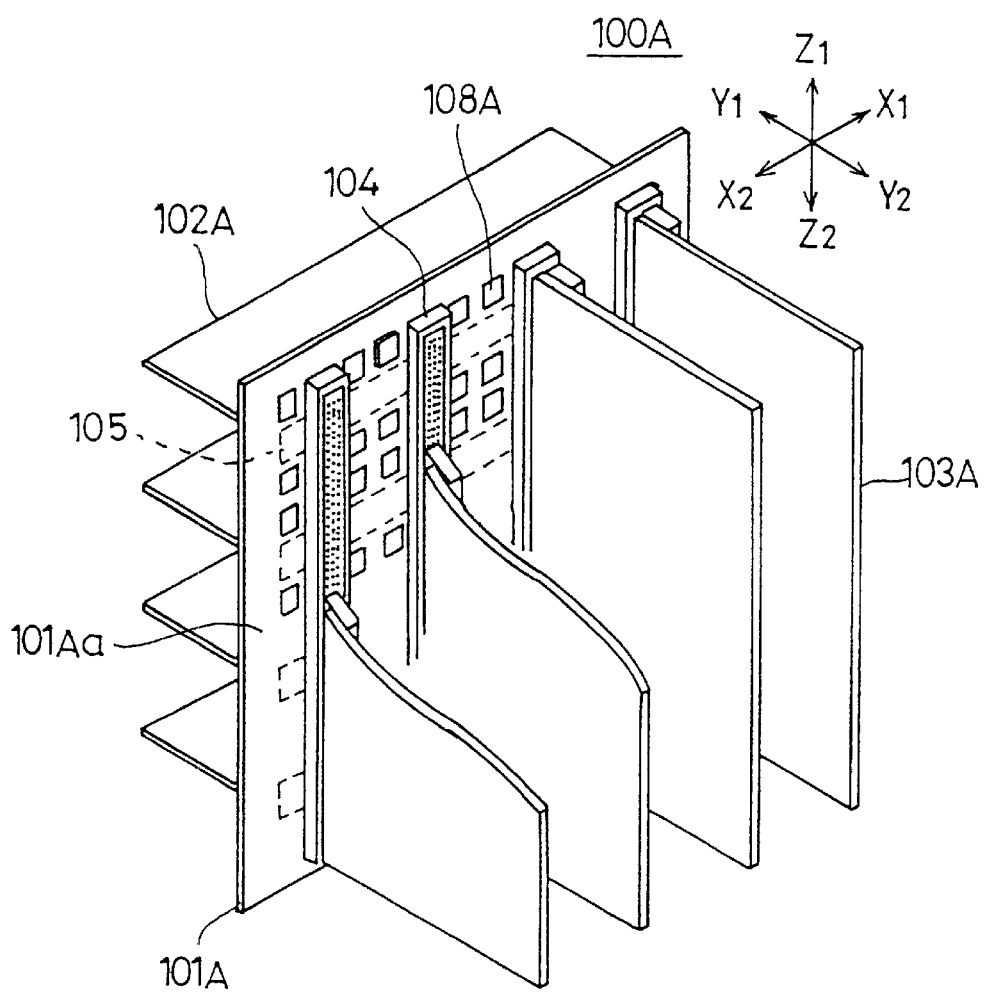
FIG. 18 shows a partially-cut-off perspective view of a printed wiring board mounting structure in a third embodiment of the present invention.

FIG. 18 shows a printed wiring board mounting structure 100A in the third embodiment of the present invention. The printed wiring board mounting structure 100A includes a back panel 101A, a plurality of rear-surface-side printed wiring board units 102A and a plurality of front-surface-side printed wiring board units 103A. When the printed wiring board mounting structure 100A is seen from the front side thereof, each of the front-surface-side printed wiring board units 103A and each of the rear-surface-side printed wiring board units 102A are in a relationship in which they are orthogonal.

Figure 19:
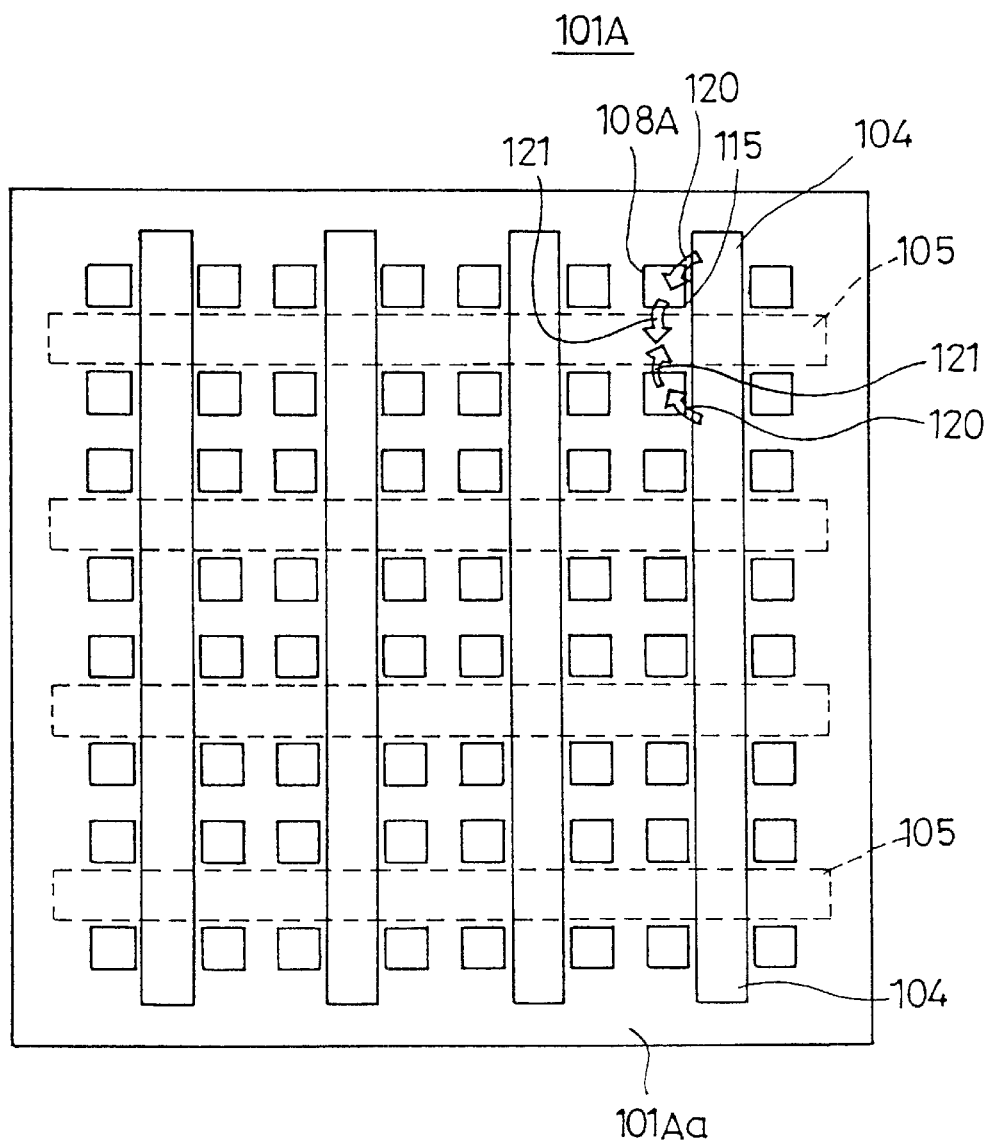
FIG. 19 shows a front elevational view of a back panel shown in FIG. 18.

With reference also to FIG. 19, on the front surface 101Aa of the back panel 101A, an LSI circuit 108A is mounted at each of four corners of a portion at which each of the connectors 104 and each of the connectors 105 cross when seen from the front side of the back panel 101A. Each of the LSI circuits 108A includes a driver and a receiver, and performs information processing.

In FIG. 19, arrows 120 and 121 show signal flows in one example. Signals output from the front-surface-side printed wiring board unit 103A pass through the connector 104 and wiring patterns in the back panel 101A, as indicated by the arrows 120, and reach the LSI circuits 108A, respectively. The signals processed in the LSI circuits 108A pass through wiring patterns in the back panel 101A, as indicated by the arrows 121, reach the connector 105, and reach the rear-surface-side printed wiring board unit 102A through the connector 105, respectively. Thus, the signal transmission paths are short. As a result, it is possible to improve the signal processing speed. As a result, it is possible to achieve the server 110 in which the signal processing speed is high in comparison to the related art.

Figure 20:
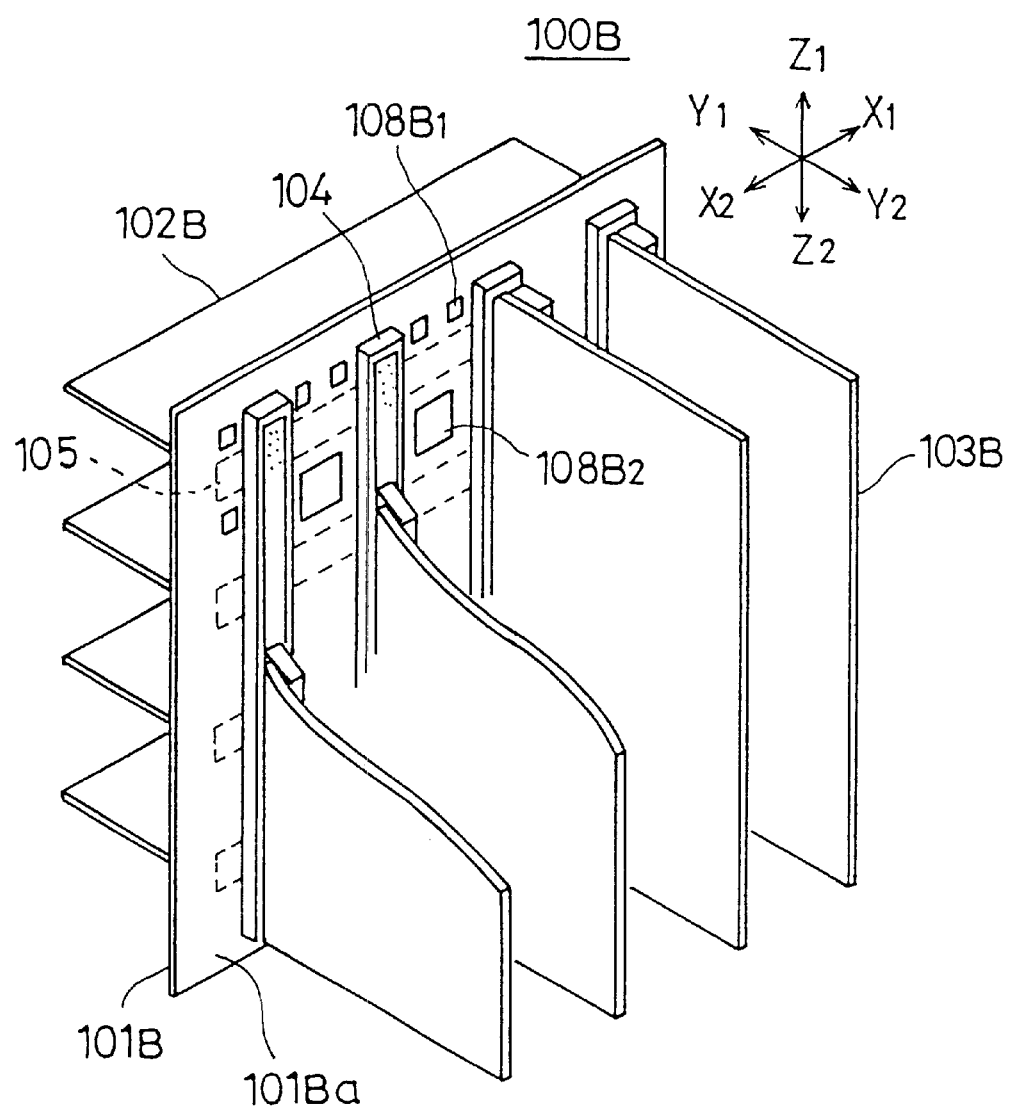
FIG. 20 shows a partially-cut-off perspective view of a printed wiring board mounting structure in a fourth embodiment of the present invention.

FIG. 20 shows a printed wiring board mounting structure 100B in the fourth embodiment of the present invention. The printed wiring board mounting structure 100B includes a back panel 101B, a plurality of rear-surface-side printed wiring board units 102B and a plurality of front-surface-side printed wiring board units 103B. When the printed wiring board mounting structure 100B is seen from the front side thereof, each of the front-surface-side printed wiring board units 103B and each of the rear-surface-side printed wiring board units 102B are in a relationship in which they are orthogonal.

Figure 21:
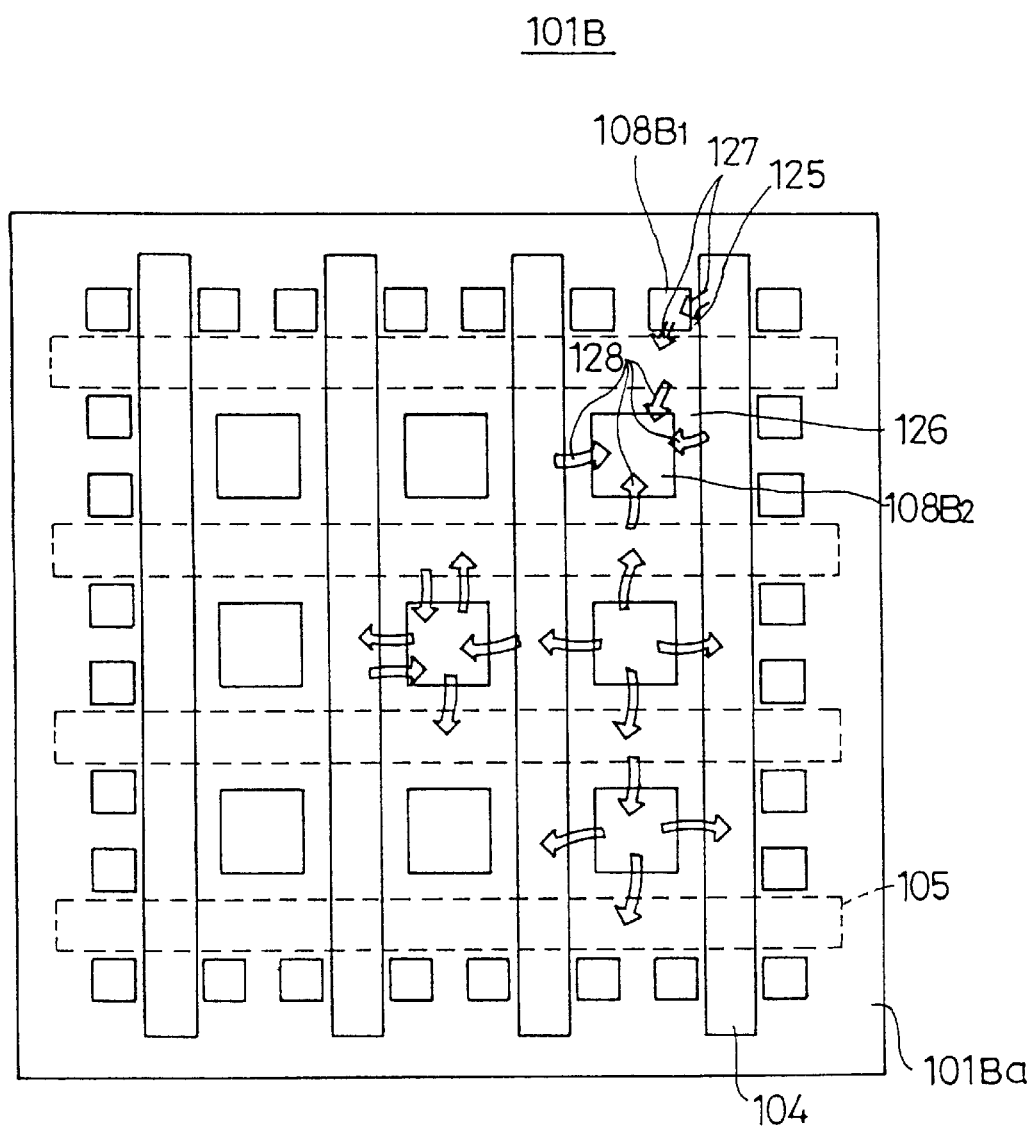
FIG. 21 shows a front elevational view of a back panel shown in FIG. 20.

With reference also to FIG. 21, LSI circuits 108B1 and 108B2, each of which includes a driver and a receiver and performs information processing, are mounted on the front surface 101B$a$ of the back panel 101B. The LSI circuits 108B1 are mounted at corners 125 of portions at which the connectors 104 and connectors 105 cross when seen from the front side of the back panel 101B. The size of each of the LSI circuits 108B2 is larger than the size of each of the LSI circuits 108B1. The LSI circuits 108B2 are mounted at portions 126, which are surrounded by the connectors 104 and 105, respectively.

In FIG. 21, arrows 127 show signal flows relating to the LSI circuit 108B1, and arrows 128 show signal flows relating to the LSI circuit 108B2. As shown in the figure, the signal transmission paths are short.

Figure 22:
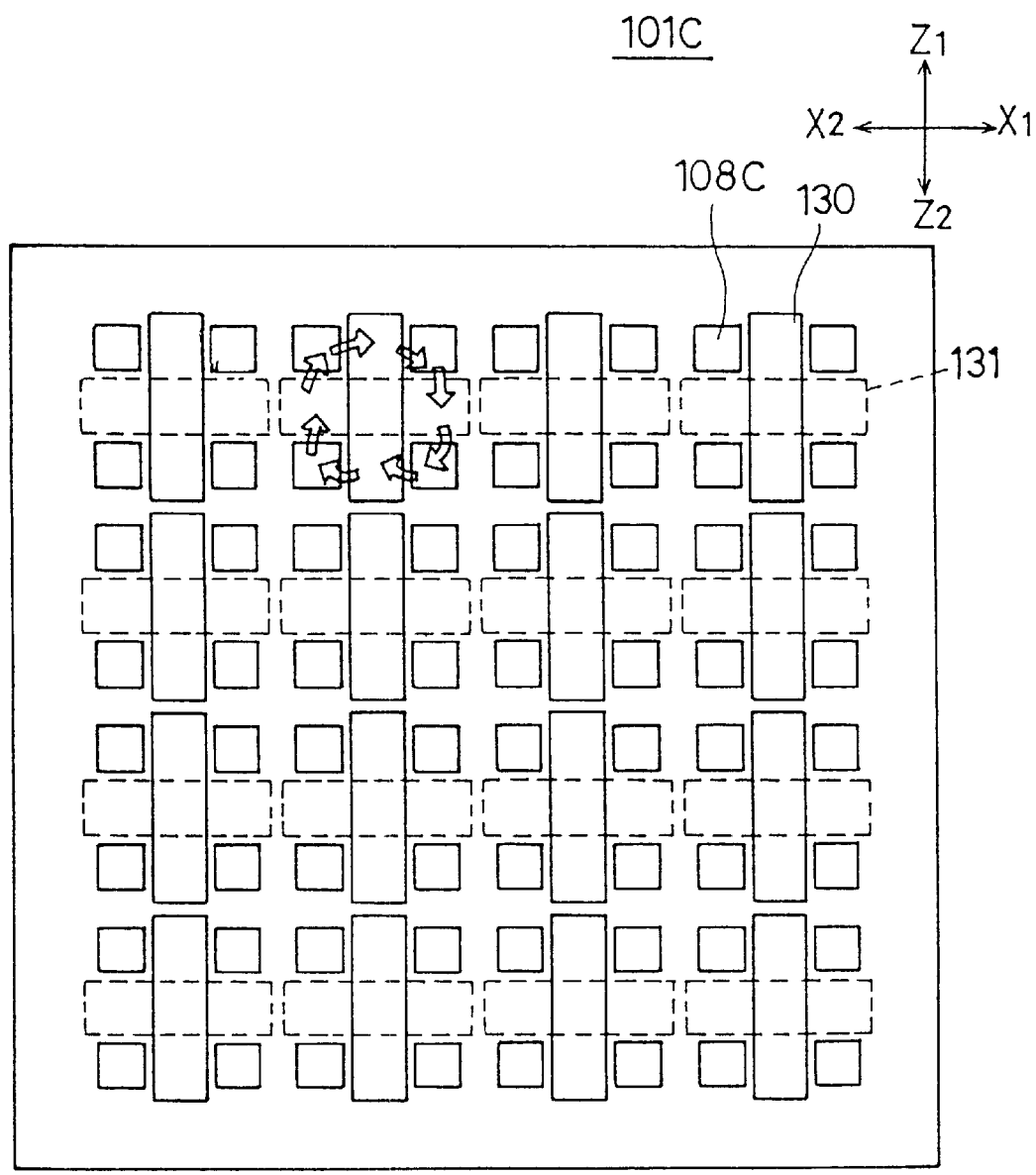
FIG. 22 shows a first variant embodiment of the back panel.

FIG. 22 shows a back panel 101C. The back panel 101C is a first variant embodiment of the back panel 101A shown in FIG. 19. Instead of each of the connectors 104 shown in FIG. 19, a plurality of connectors 130 are aligned in the Z1–Z2 directions straightly. Further, instead of each of the connectors 105 shown in FIG. 19, a plurality of connectors 131 are aligned in the X1–X2 directions straightly. Further, when seen from the front side of the back panel 101C, each of the connectors 130 and a respective one of the connectors 131 cross.

Figure 23:
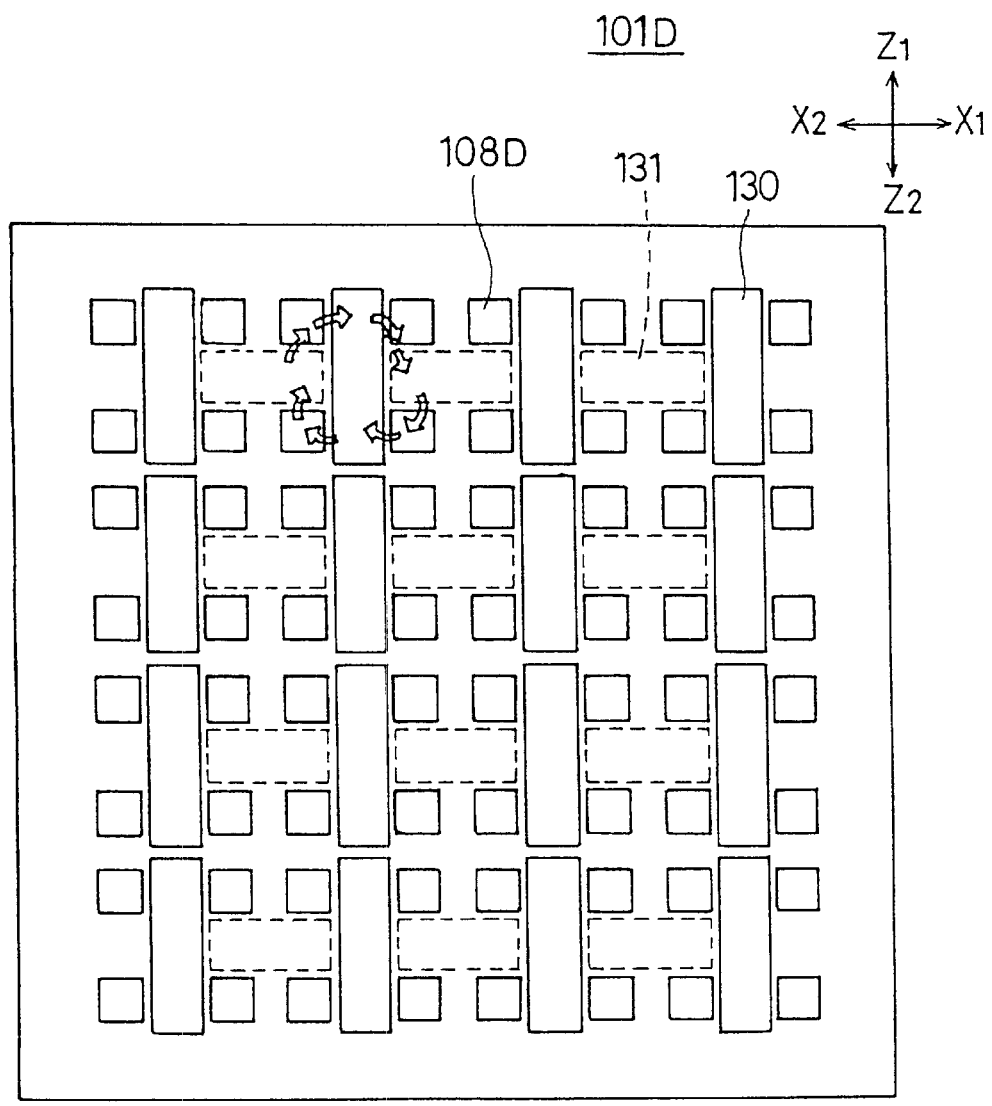
FIG. 23 shows a second variant embodiment of the back panel.

FIG. 23 shows a back panel 101D. The back panel 101D is a second variant embodiment of the back panel 101A shown in FIG. 19. The back panel 101D is different from the above-described back panel 101C in a point that each of connectors 131 is located between respective adjacent ones of connectors 130, and, when seen from the front side of the back panel 101D, the connectors 130 and the connectors 131 do not cross. The back panel 101D does not have the common pins.

In the back panel 101D shown in FIG. 23, it is possible to provide wiring patterns in the back panel 101D for connecting the connectors 130 with the connectors 131. In this case, it is possible that LSI circuits 108D are not provided.

Further, the present invention is not limited to the above-described embodiments, and variations and modifications may be made without departing from the scope of the present invention.

The contents of the basic Japanese Patent Application No. 10-119021, filed on Apr. 28, 1998, are hereby incorporated by reference.

What is claimed is:

1. A printed wiring board mounting structure comprising:
   a back panel having a plurality of wiring layers, front surface-side connectors on the front surface of said back panel and at least one rear-surface-side connector on the rear surface thereof;
   a plurality of front-surface-side printed wiring boards which are mounted on said back panel as a result of connectors provided on said plurality of front-surface-side printed wiring boards being connected with said front-surface-side connectors; and
   at least on e rear-surface-side printed wiring board which is mounted on said back panel as a result of at least one connector provided on said at least one rear-surface-side printed wiring board being connected with said at least one rear-surface-side connector,
      wherein, when seen from the front side of said back panel, said at least one rear-surface-side printed wiring board connected with said at least one rear-surface-side connector crosses said front-surface-side printed wiring boards connected with said front-surface-side connectors, and
      wherein said printed wiring boards each produce connections disposed in a column and said front-surface-side printed wiring boards are connected to said rear-surface-side printed wiring boards without the use of common pins by a plurality of connectors disposed for each column.

* * * * *